(12) United States Patent
Mizukami

(10) Patent No.: US 10,112,391 B2
(45) Date of Patent: Oct. 30, 2018

(54) ELECTROMECHANICAL TRANSDUCER ELEMENT, LIQUID DROPLET DISCHARGE HEAD, AND IMAGE FORMING APPARATUS

(71) Applicant: Satoshi Mizukami, Kanagawa (JP)

(72) Inventor: Satoshi Mizukami, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 494 days.

(21) Appl. No.: 14/956,689

(22) Filed: Dec. 2, 2015

(65) Prior Publication Data

US 2016/0167383 A1 Jun. 16, 2016

(30) Foreign Application Priority Data

Dec. 12, 2014 (JP) ................. 2014-251811

(51) Int. Cl.
| | | |
|---|---|---|
| *H01L 41/04* | (2006.01) | |
| *B41J 2/14* | (2006.01) | |
| *H01L 41/08* | (2006.01) | |
| *H01L 41/09* | (2006.01) | |
| *H01L 41/187* | (2006.01) | |
| *H01L 41/318* | (2013.01) | |

(52) U.S. Cl.
CPC ...... *B41J 2/14233* (2013.01); *H01L 41/0815* (2013.01); *H01L 41/0973* (2013.01); *H01L 41/1876* (2013.01); *B41J 2202/03* (2013.01); *H01L 41/318* (2013.01)

(58) Field of Classification Search
CPC .... C09D 5/24; H01B 1/02; H01B 1/22; H04L 41/297
USPC ................................. 310/358, 360
See application file for complete search history.

(56) References Cited

U.S. PATENT DOCUMENTS

| | | |
|---|---|---|
| 7,717,546 B2 | 5/2010 | Noguchi et al. |
| 8,454,133 B2 | 6/2013 | Mizukami et al. |
| | (Continued) | |

FOREIGN PATENT DOCUMENTS

| | | |
|---|---|---|
| JP | 2008-028030 | 2/2008 |
| JP | 2008-192868 | 8/2008 |
| | (Continued) | |

OTHER PUBLICATIONS

U.S. Appl. No. 14/715,670, filed May 19, 2015.
U.S. Appl. No. 14/867,350, filed Sep. 28, 2015.

*Primary Examiner* — Thomas Dougherty
(74) *Attorney, Agent, or Firm* — Cooper & Dunham LLP

(57) ABSTRACT

An electromechanical transducer element includes a lower electrode, an electromechanical transducer film of a piezoelectric material, and an upper electrode which are laminated. A diffraction intensity peak profile of the film obtained by measurement in which a tilt angle is changed in a position where diffraction intensity of a peak profile corresponding to a {200} plane among peak profiles of the film obtained by measurement according to an X-ray diffraction θ-2θ method is the maximum can be separated into three peak profiles. When peak intensities of the peak profiles are set to peak1, peak2, and peak3 and half-value widths of the peak profiles are set to σ1, σ2, and σ3, a weighted average FWHMstd($\chi$) of the peak intensities using the half-value widths as weights (=(σ1×peak1+σ2×peak2+σ3×peak3)/(peak1+peak2+peak3)) is equal to or less than 12°.

12 Claims, 12 Drawing Sheets

(56) References Cited

U.S. PATENT DOCUMENTS

| | | |
|---|---|---|
| 8,602,530 B2 | 12/2013 | Mizukami et al. |
| 8,678,563 B2 | 3/2014 | Itayama |
| 8,727,505 B2 | 5/2014 | Mizukami et al. |
| 8,733,904 B2 | 5/2014 | Mizukami |
| 8,733,906 B2 | 5/2014 | Mizukami et al. |
| 8,777,382 B2 | 7/2014 | Kato et al. |
| 8,919,926 B2 | 12/2014 | Mizukami et al. |
| 8,926,069 B2 | 1/2015 | Ishimori et al. |
| 8,960,867 B2 | 2/2015 | Ishimori et al. |
| 9,022,530 B2 | 5/2015 | Ohashi |
| 9,168,744 B2 | 10/2015 | Mizukami et al. |
| 9,186,894 B2 | 11/2015 | Mizukami et al. |
| 2013/0162726 A1 | 6/2013 | Mizukami et al. |
| 2015/0077474 A1* | 3/2015 | Mawatari ............ H01L 41/0973 347/68 |
| 2015/0085023 A1* | 3/2015 | Sakai .................... H01L 41/053 347/70 |
| 2015/0364670 A1* | 12/2015 | Ohta .................. H01L 41/1873 310/360 |
| 2016/0263893 A1* | 9/2016 | Mizukami ............ B41J 2/14233 |

FOREIGN PATENT DOCUMENTS

| | | |
|---|---|---|
| JP | 2012-124233 | 6/2012 |
| JP | 2012-253161 | 12/2012 |
| JP | 2013-118232 | 6/2013 |

\* cited by examiner

ELECTROMECHANICAL TRANSDUCER ELEMENT, LIQUID DROPLET DISCHARGE HEAD, AND IMAGE FORMING APPARATUS

CROSS-REFERENCE TO RELATED APPLICATION

The present application is based upon and claims the benefit of priority of Japanese Patent Application No. 2014-251811, filed on Dec. 12, 2014, the contents of which are incorporated herein by reference in their entirety.

BACKGROUND OF THE INVENTION

1. Field of the Invention

The present invention relates to an electromechanical transducer element, a liquid droplet discharge head, and an image forming apparatus.

2. Description of the Related Art

Conventionally, there is known a liquid droplet discharge device which incorporates a liquid droplet discharge head, the liquid droplet discharge head including nozzles to discharge droplets of ink (liquid for image formation), a liquid chamber in communication with the nozzles, and a pressure generation unit to generate pressure in the ink in the liquid chamber. It is also known that an example of the pressure generation unit is one in which a piezoelectric electromechanical transducer element having an electromechanical transducer film of a piezoelectric material is disposed on a diaphragm that forms a part of a wall surface of a liquid chamber.

Japanese Laid-Open Patent Publication No. 2008-192868 discloses a configuration of an electromechanical transducer element in which a lower electrode, an electromechanical transducer film having a perovskite crystal structure such as lead zirconate titanate (PZT), and an upper electrode are laminated. Also disclosed is that, in the electromechanical transducer film having the perovskite crystal structure, increasing (100) plane crystal orientation (crystal orientation ratio 80% or greater), aligning spontaneous polarization axis directions, and forming an electric field in the aligned direction allows the amount of distortion of the electromechanical transducer element due to the piezoelectric effect thereof to be increased.

However, it is confirmed that, even in the electromechanical transducer element disclosed in Japanese Laid-Open Patent Publication No. 2008-192868, there may be a case where it is difficult to provide a sufficient amount of distortion and the electromechanical transducer element does not fully function as a stable and efficient electromechanical transducer.

SUMMARY OF THE INVENTION

In an embodiment which solves or reduces one or more of the above-described problems, the present invention provides an electromechanical transducer element including: a lower electrode formed directly or indirectly on one of a substrate and a base layer; an electromechanical transducer film of a piezoelectric material formed on the lower electrode, the electromechanical transducer film having a {100}-oriented perovskite crystal structure; and an upper electrode formed on the electromechanical transducer film, wherein the electromechanical transducer film has characteristics such that a diffraction intensity peak profile of the film obtained by measurement in which a tilt angle ($\chi$) is changed, in a position (2θ) where a diffraction intensity of a diffraction intensity peak profile corresponding to a {200} plane among diffraction intensity peak profiles of the film obtained by measurement according to an X-ray diffraction θ-2θ method is the maximum, is capable of being separated into three peak profiles by peak separation, and when peak intensities of the three peak profiles are set to peak1, peak2, and peak3 and half-value widths of the three peak profiles are set to σ1, σ2, and σ3, a weighted average FWHMstd($\chi$) of the peak intensities using the half-value widths σ1, σ2, and σ3 as weights (FWHMstd($\chi$)=(σ1×peak1+σ2×peak2+σ3×peak3)/(peak1+peak2+peak3)) is equal to or less than 12°.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DETAILED DESCRIPTION OF THE PREFERRED EMBODIMENTS

Figure 1:
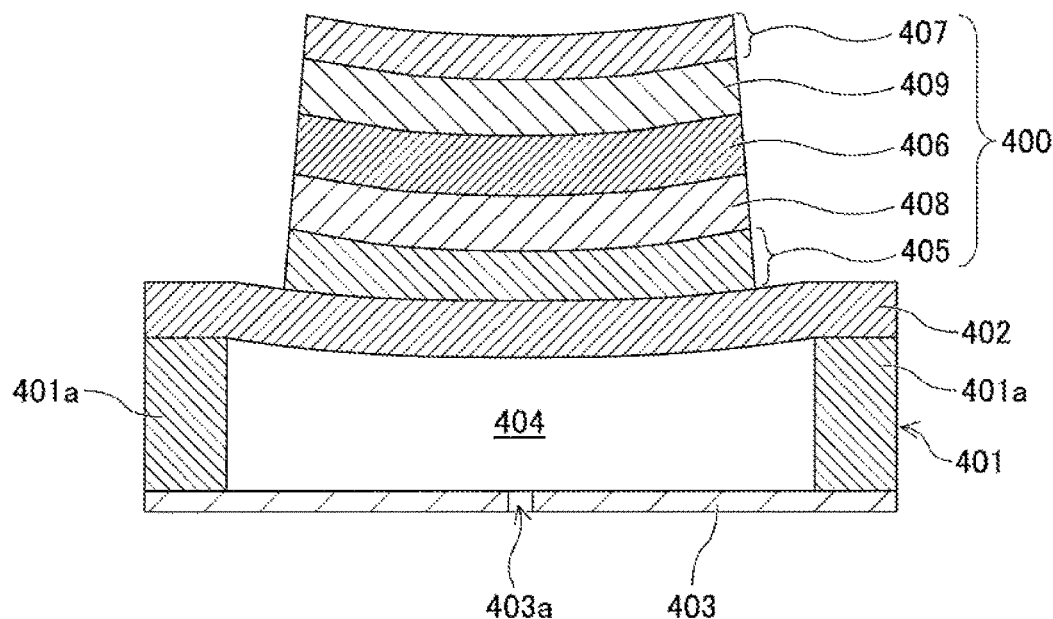
FIG. 1 is a cross-sectional view of an example configuration of a liquid droplet discharge head according to an embodiment.

A description will be given of embodiments with reference to the accompanying drawings.

In the following, the present invention is applied to an electromechanical transducer element which forms a part of a liquid droplet discharge head used in an inkjet recording device which is an image forming apparatus (liquid droplet discharge device).

In the following, {hkl} may indicate a representative crystal plane selected from (hkl) and other crystal planes equivalent to (hkl) because of the symmetry in which spontaneous polarization direction in the piezoelectric material is not taken into consideration. Further, {hkl} may indicate one crystal plane selected from (hkl) and other crystal planes equivalent to (hkl), and may indicate two or more crystal planes selected from (hkl) and other crystal planes equivalent to (hkl). For example, in an electromechanical transducer film having a perovskite crystal structure, {100} indicates one or more of a plurality of crystal planes including (100) plane and another five crystal planes equivalent to (100) plane. Further, in the following, a peak of diffraction intensity refers to a convex part of a diffraction intensity curve obtained by measurement of X-ray diffraction, and does not refer to the maximum of diffraction intensity.

An inkjet recording device has various advantageous features: the noise level is low; high-speed printing may be performed; the flexibility of ink (liquid for image formation) may be provided; and inexpensive plain paper may be used. Thus, the inkjet recording devices are widely deployed as image forming apparatuses, such as a printer, a facsimile machine, and a copier.

A liquid droplet discharge head used in the inkjet recording device includes a nozzle to discharge ink droplets (droplets of liquid for image formation), a pressure chamber in communication with the nozzle, and a pressure generation unit to generate pressure for discharging the ink in the pressure chamber. The pressure generation unit may be a piezoelectric pressure generation unit including a diaphragm which forms a part of a wall surface of the pressure chamber, and an electromechanical transducer element having a thin electromechanical transducer film of a piezoelectric material to deform the diaphragm. The electromechanical transducer element is deformed by applying a predetermined voltage thereto, and pressure in the ink in the pressure chamber is generated when the surface of the diaphragm is displaced into the pressure chamber. By the generated pressure, ink droplets (liquid droplets) may be discharged from the nozzle in communication with the pressure chamber.

The piezoelectric material included in the electromechanical transducer film is a material having piezoelectric characteristics in which deformation is caused by voltage application. As this piezoelectric material, lead zirconate titanate (PZT:Pb(Zr$_x$, Ti$_{1-x}$)O$_3$) which is a metal oxide having a perovskite crystal structure may be used. As an oscillation mode when a drive voltage is applied to the electromechanical transducer element having the electromechanical transducer film made of PZT (which will be called a "PZT film"), there are various oscillation modes. For example, in a longitudinal vibration mode (push mode), a deformation in the thickness direction may occur due to the piezoelectric constant d33, and in a transverse oscillation mode (bend mode), a bending deformation may occur due to the piezoelectric constant d31. Further, there may be a shear mode in which a shear deformation of a membrane is utilized.

As will be described later, the techniques of semiconductor processes and Micro Electro Mechanical Systems (MEMS) may be used to form the electromechanical transducer element having the PZT film such that the pressure chamber and the electromechanical transducer element are formed directly on a Si substrate. Hence, the electromechanical transducer element may be formed as a thin-film piezoelectric actuator that generates pressure in the pressure chamber.

Next, an example configuration of a liquid droplet discharge head including a piezoelectric actuator 400 as an electromechanical transducer element according to an embodiment will be described.

FIG. 1 is a cross-sectional view of an example configuration of the liquid droplet discharge head according to the embodiment.

As shown in FIG. 1, the liquid droplet discharge head includes a substrate 401, a diaphragm 402, a nozzle plate 403, a pressure chamber 404, a first electrode 405 as a lower electrode, a PZT film 406 as an electromechanical transducer film, and a second electrode 407 as an upper electrode. The pressure chamber 404 is formed so that the pressure chamber 404 is surrounded by a partition part 401*a* formed on the substrate 401, the diaphragm 402, and the nozzle plate 403, and this pressure chamber 404 is in communication with the nozzle 403*a* of the nozzle plate 403.

It is preferable to use a silicon monocrystal substrate as a material of the substrate 401. It is preferable that the substrate 401 has a thickness in a range from 100 μm to 600 μm. As the plane directions, there are three types: {100}, {110}, and {111}. In the semiconductor industry, {100} and are widely used. In this embodiment, the silicon monocrystal substrate 401 having plane direction of {100} is mainly used.

When the pressure chamber 404 as shown in FIG. 1 is formed, a silicon monocrystal substrate is processed using etching. As the etching in this case, anisotropic etching is commonly used. In the anisotropic etching, etching speeds differ depending on the plane directions of the crystal structure. For example, in the anisotropic etching in which the substrate is immersed in an alkali solution such as KOH, the etching speed in {111} plane is approximately one four-hundredth of the etching speed in {100} plane. Therefore, in the plane of {100}, it is possible to form a structure having an inclination of approximately 54°. On the other hand, in the plane of {110}, it is possible to form a structure having a deep groove. Thus, it is known that, in the plane of {110}, it is possible to increase layout density while maintaining the stiffness. In this regard, in this embodiment, it is possible to use a monocrystal substrate having plane direction {110}. However, in this case, SiO$_2$, which is a mask material, may also be etched. Therefore, care should be taken when the monocrystal substrate having plane direction is used.

By receiving the force generated by the PZT film 406, the diaphragm 402 is deformed and displaced so that the ink droplets in the pressure chamber 404 are discharged from the nozzle 403*a*. Hence, it is preferable that the diaphragm 402 has a predetermined strength. As a material of the diaphragm 402, a material formed from Si, SiO$_2$, and Si$_3$N$_4$ by a CVD (Chemical Vapor Deposition) method is used.

Further, it is preferable to use a material having a coefficient of linear expansion similar to those of the first electrode 405 and the PZT film 406 as a material of the diaphragm 402. Especially, PZT is generally used as the material of the PZT film 406. Therefore, as the coefficient of linear expansion of the diaphragm 402 similar to the coefficient of linear expansion $8 \times 10^{-6}$ 1/K, it is preferable to use a material having the coefficient of linear expansion in a range from $5 \times 10^{-6}$ 1/K to $10 \times 10^{-6}$ 1/K. It is more preferable to use a material having the coefficient of linear expansion in a range from $7 \times 10^{-6}$ 1/K to $9 \times 10^{-6}$ 1/K as a material of the diaphragm 402.

As a specific material of the diaphragm 402, aluminum oxide, zirconium oxide, iridium oxide, ruthenium oxide, tantalum oxide, hafnium oxide, osmium oxide, rhenium oxide, rhodium oxide, palladium oxide, and a compound thereof may be used. The diaphragm 402 may be formed by a spin coater using a sputtering method or a sol-gel method based on the material described above. It is preferable that the diaphragm 402 has a film thickness in a range from 0.1 μm to 10 μm. It is more preferable that the film thickness is in a range from 0.5 μm to 3 μm. When the film thickness of the diaphragm 402 is less than the range, it becomes difficult to form the pressure chamber 404. On the other hand, when the film thickness is greater than the range, it becomes difficult for the base layer to be deformed and displaced so that the discharge of ink droplets becomes unstable.

Further, it is preferable to form the diaphragm 402 by laminating a plurality of films with tensile stress or compressive stress by a low pressure (LP) CVD method. In the case of a single-film diaphragm 402, a silicon-on-insulator (SOI) wafer may be used as a material of the diaphragm. In this case, the cost of the wafer is increased, and it is impossible to set the membrane stress to a desired one when adjusting the flexural stiffness. On the other hand, in the case of a diaphragm 402 having a laminated structure, the flexibility of setting the stiffness and the membrane stress of the diaphragm 402 to desired values may be obtained by optimizing the laminated structure. Hence, the stiffness and the membrane stress of the whole diaphragm 402 may be controlled by a combination of the lamination, the film thickness, and the laminated structure.

Therefore, the materials and the film thicknesses of the electrode layers and ferroelectric layers which form the piezoelectric actuator (piezoelectric element) may be selected appropriately. Because the diaphragm 402 in which changes of the stiffness and stress of the diaphragm 402 due to the sintering temperature of the piezoelectric actuator (piezoelectric element) are reduced and stabilized is obtained, it is possible to provide a liquid droplet discharge head with accurate and stable droplet discharge characteristics.

The first electrode 405 as the lower electrode is a layer of a metal material. Conventionally, platinum (Pt) having high heat resistance and low reactivity has been used as the metal material. However, platinum (Pt) may not have sufficient barrier properties against lead (Pb). In this regard, a film of a platinum group element such as iridium, platinum rhodium, etc., or an alloy film thereof may be used. Further, when platinum (Pt) is used, adhesion of Pt with the base layer (especially with $SiO_2$) is poor, and it is preferable to form an adhesive layer of one selected from Ti, $TiO_2$, Ta, $Ta_2O_5$, and $Ta_3N_5$ prior to the formation of the Pt layer. As a method of forming the first electrode 405, a vacuum film formation such as a sputtering method and a vacuum vaper deposition method is generally used. It is preferable that the first electrode 405 has a film thickness in a range from 0.02 μm to 0.1 μm. It is more preferable that the film thickness is in a range from 0.05 μm to 0.1 μm. Further, it is preferable to form a first oxide layer 408 which is made of a conductive oxide, such as $SrRuO_3$, between the first electrode 405 and the PZT film 406 in order to prevent the temporal deformation fatigue of the PZT film 406.

The material of the first oxide layer 408 greatly influences the crystalline growth of the PZT film 406 formed on the first oxide layer 408. Hence, it is necessary to select an appropriate material of the first oxide layer 408 depending on the plane direction of the PZT film 406 which is oriented preferentially. In this embodiment, in order to promote the {100} orientation of the PZT film 406, one selected from $LaNiO_3$, $TiO_2$, $PbTiO_3$, etc., is used as the material of the first oxide layer 408. It is preferable that the first oxide layer 408 has a film thickness in a range from 20 nm to 80 nm. It is more preferable that the film thickness is in a range from 30 nm to 50 nm. When the film thickness is less than the range, sufficient distortion in the initial state and prevention of distortion degradation cannot be provided. When the film thickness exceeds the range, the dielectric withstand voltage of the PZT film 406 formed on the first oxide layer 408 will deteriorate and leakage is likely to occur.

Similar to the first electrode 405 described above, the second electrode 407 as the upper electrode may be formed of a metal material, such as platinum (Pt). Further, it is preferable to form a second oxide layer 409 between the PZT film 406 and the second electrode 407 in order to maintain adhesion between the film of platinum and the PZT film 406. For example, the second oxide layer 409 is made of a conductive oxide, such as $SrRuO_3$.

The PZT film 406 is made of a piezoelectric material having a perovskite crystal structure, which is mainly made of a solid solution of lead zirconate ($PbZrO_3$) and lead titanate ($PbTiO_3$), and the characteristics of PZT vary depending on the ratio of lead zirconate and lead titanate. The composition between lead zirconate ($PbZrO_3$) and lead titanate ($PbTiO_3$) which provides excellent piezoelectric property is usually in a ratio of 53:47, which is represented by the chemical formula $Pb(Zr_{0.53}Ti_{0.47})O_3$ and also denoted by "PZT(53/47)". As a compound oxide other than PZT, barium titanate may be used as the material of the PZT film 406. In this case, barium alkoxide and titanium alkoxide compound as starting materials may be dissolved in a common solvent to prepare a barium titanate precursor solution.

These materials are described in a general formula $ABO_3$ where A=Pb, Ba, or Sr, B=Ti, Zr, Sn, Ni, Zn, Mg, or Nb as the main ingredients of the compound oxide. In more specific formulas, there are $(Pb_{1-x}Ba_x)(Zr,Ti)O_3$ where "Pb" in A site is partially substituted for by "Ba", and $(Pb)(Zr_x, Ti_y, Nb_{1-x-y})O_3$ where "Zr" and "Ti" in B site are partially substituted for by "Nb". Such substitution may be done in a case of a bivalent element. The effect of the substitution is to reduce the degradation of the displacement characteristics (or distortion characteristics) of PZT due to evaporation of Pb during a heat treatment. As a method of forming the PZT film, a sputtering method or a sol-gel method may be used with a spin coater. In this case, a patterning process is needed, and a desired pattern is formed by photolithography and etching.

When the PZT film 406 is formed by the sol-gel method, lead acetate, zirconium alkoxide, and titanium alkoxide compound as the starting materials may be dissolved in methoxyethanol as a common solvent to acquire a homogeneous solution, and a PZT precursor solution may be prepared. A metal alkoxide compound is susceptible to hydrolysis with moisture in the atmospheric air. Hence, an appropriate amount of acetylacetone, acetic acid, diethanolamine, etc., may be added as a stabilizer to the PZT precursor solution. When the PZT film is formed on the entire surface of the base substrate, a coated film is formed by a solution application method such as spin coating. Then, the coated film is heated by heating processes for drying solvent, thermal decomposition, and crystallization. In the transformation from the coated film to the crystallized film, volume contraction also occurs. In order to obtain a crack-free film, it is desired to adjust the precursor concentration so that the PZT film having the film thickness of 100 nm or less may be obtained within one process.

It is preferable that the PZT film 406 has a film thickness in a range from 0.5 µm to 5 µm. It is more preferable that the film thickness is in a range from 1 µm to 2 µm. When the film thickness of the PZT film 406 is less than the range, it becomes difficult to form the pressure chamber 404 as shown in FIG. 1. On the other hand, when the film thickness of the PZT film 406 is greater than the range, it is difficult to provide sufficient distortion of the diaphragm 402 as the base layer, and the discharge of ink droplets becomes unstable. Further, when the film thickness of the PZT film 406 is greater than the range, the number of processes to laminate several thin layers is increased and the processing time is also increased.

The shape of a unit cell of a PZT crystal taking the $ABO_3$ perovskite structure varies depending on the ratio of Ti and Zr which are the elements in B site. If the ratio of Ti is increased, the PZT crystal structure becomes tetragonal. If the ratio of Zr is increased, the PZT crystal structure becomes rhombohedral. Further, if the composition ratio of Zr and Ti is adjusted, a position (2θ) where a diffraction intensity in a diffraction intensity peak profile corresponding to the {200} plane of the PZT film 406, among diffraction intensity peak profiles obtained by measurement according to an X-ray diffraction θ-2θ method, is the maximum is changed.

The θ-2θ method is a commonly used X-ray diffraction measurement technique. In the θ-2θ method, an X-ray is made to enter a sample substrate at an angle of θ measured from the substrate surface, then an X-ray component at an angle of 2θ with respect to the direction of the entered X-ray is detected from the X-ray reflected from the sample substrate. A change of diffraction intensity when θ is changed is determined by the result of the detection. In diffraction using an X-ray, when the Bragg's condition ($2d \sin \theta = n\lambda$ (λ: a wavelength of an X-ray, d: an atomic inter-planar spacing of a crystal, n: an integer)) is satisfied, diffraction intensity increases, and inter-planar spacing (lattice constant) of the crystal at that time is in correlation with 2θ described above. Thus, based on a value of 2θ at which the diffraction intensity increases, the crystal structure of the sample substrate that the X-ray has entered can be grasped.

Figure 2:
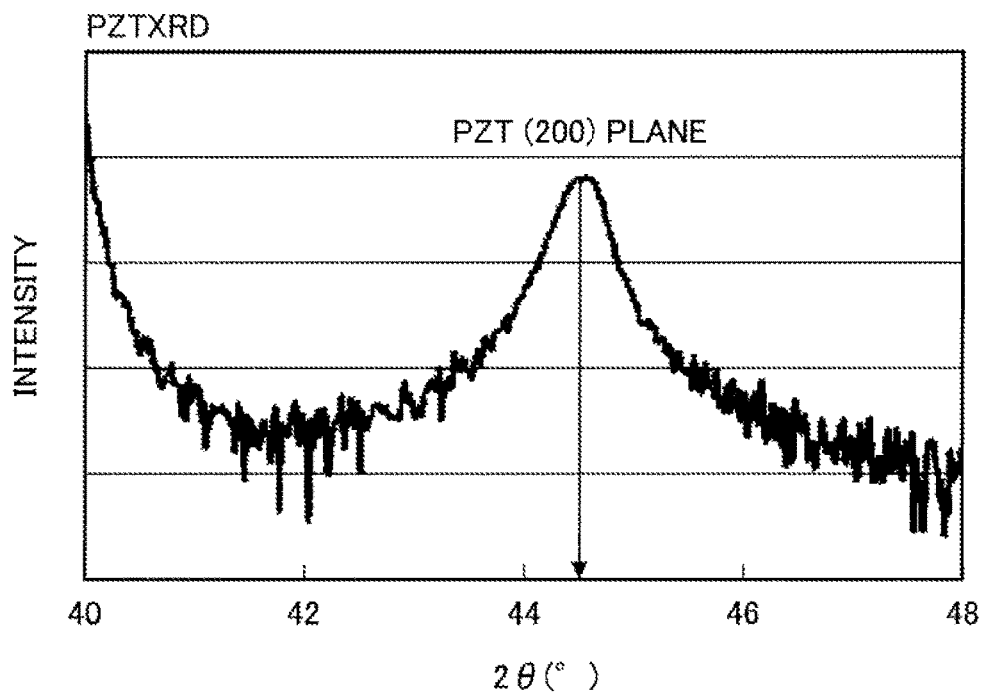
FIG. 2 is a graph of an example diffraction intensity peak profile of a {200} plane of a {100}-oriented PZT film obtained by measurement according to an X-ray diffraction θ-2θ method.

FIG. 2 is a graph of an example peak profile of diffraction intensity corresponding to a {200} plane of the PZT film 406 among diffraction intensity peak profiles obtained by the measurement according to the X-ray diffraction θ-2θ method. When a back surface of the substrate 401 is etched and there is no restriction in the etched portion of the back surface of the substrate 401, it is preferable that the value of 2θ is in a range from 44.45° to 44.75°. In a case of the {100}-oriented PZT film 406, in order to set the value of 2θ within the range, it is preferable that the composition ratio of Zr and Ti which is represented by Ti/(Zr+Ti) is in a range from 0.45 to 0.55. Further, it is more preferable that the composition ratio of Zr and Ti is in a range from 0.48 to 0.52.

When the composition ratio of Zr and Ti is less than the lower limit of 0.45, the effect of the domain rotation (which will be described later) becomes insufficient, and it becomes difficult to provide a sufficient amount of distortion of the electromechanical transducer element. On the other hand, when the composition ratio of Zr and Ti is greater than the upper limit of 0.55, the piezoelectric effect becomes insufficient and it becomes difficult to provide a sufficient amount of distortion of the electromechanical transducer element.

Figure 3A:
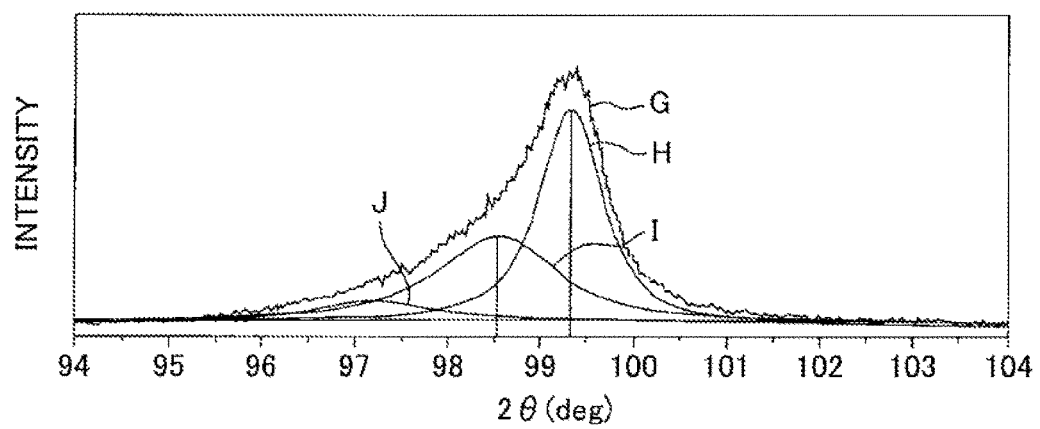
FIGS. 3A and 3B are graphs for explaining a degree of asymmetry of a diffraction intensity peak profile of a {100}-oriented PZT film obtained by the measurement according to the X-ray diffraction θ-2θ method.
Figure 3B:
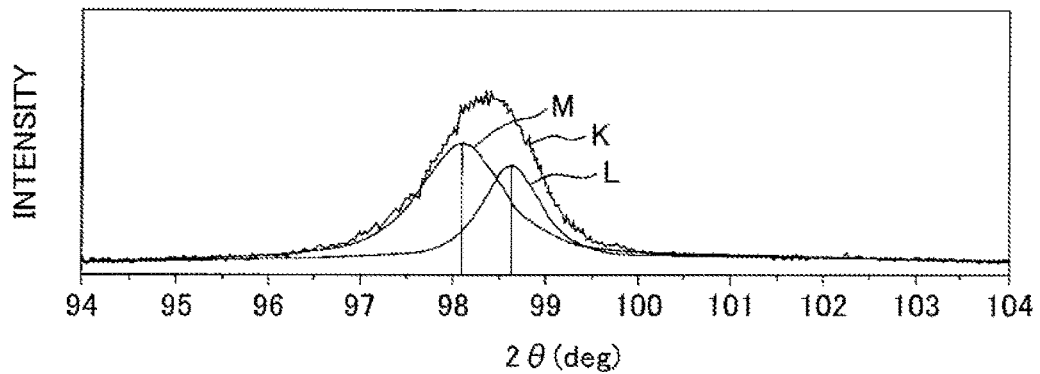

Further, a degree of asymmetry of the shape of the diffraction intensity peak profile obtained by the measurement according to the X-ray diffraction θ-2θ method varies (increases or decreases) depending on the composition ratio of Zr and Ti. FIGS. 3A and 3B are graphs for explaining a degree of asymmetry of the shape of diffraction intensity peak profiles in a {100}-oriented PZT film obtained by the measurement according to the X-ray diffraction θ-2θ method. FIG. 3A shows a case in which the degree of asymmetry of the shape of the diffraction intensity peak profile (indicated by "G" in FIG. 3A) is high. In this case, the PZT film crystal structure is derived from an a-axis domain tetragonal structure, a c-axis domain tetragonal structure, and one selected from a rhombohedral structure, an orthorhombic structure, and a pseudo-cubic structure. The peak profile of diffraction intensity indicated by "G" in FIG. 3A is a cumulative sum of the peak profile corresponding to the a-axis domain tetragonal structure indicated by "H" in FIG. 3A, the peak profile corresponding to the c-axis domain tetragonal structure indicated by "J" in FIG. 3A, and the peak profile corresponding to one selected from the rhombohedral structure, the orthorhombic structure, and the pseudo-cubic structure indicated by "I" in FIG. 3A. As shown in FIG. 3A, the peak position of the a-axis domain tetragonal structure and the peak position of the c-axis domain tetragonal structure are greatly separated from each other because the difference in length between the a-axis domain and the c-axis domain is great. Further, the maximum of the peak profile of the c-axis domain tetragonal structure is smaller than the maximum of the peak profile of the a-axis domain tetragonal structure because the ratio of the a-axis domain tetragonal structure is greater in the thickness direction of the PZT film.

FIG. 3B shows a case in which the degree of asymmetry of the shape of the diffraction intensity peak profile (indicated by "K" in FIG. 3B) is low. In this case, the PZT film crystal structure is derived from an a-axis domain tetragonal structure and a c-axis domain tetragonal structure. The diffraction intensity peak profile indicated by "K" in FIG. 3B is a cumulative sum of the peak profile corresponding to the a-axis domain tetragonal structure indicated by "M" in FIG. 3B and the peak profile corresponding to the c-axis domain tetragonal structure indicated by "L" in FIG. 3B. As shown in FIG. 3B, the peak position of the a-axis domain tetragonal structure and the peak position of the c-axis domain tetragonal structure are adjacent to each other because the difference in length between the a-axis domain and the c-axis domain is small. Further, the maximum of the peak profile of the a-axis domain tetragonal structure and the maximum of the peak profile of the c-axis domain tetragonal structure are almost the same because the ratio of the a-axis domain tetragonal structure in the thickness direction of the PZT film is almost the same as the ratio of the c-axis domain tetragonal structure.

Figure 4A:
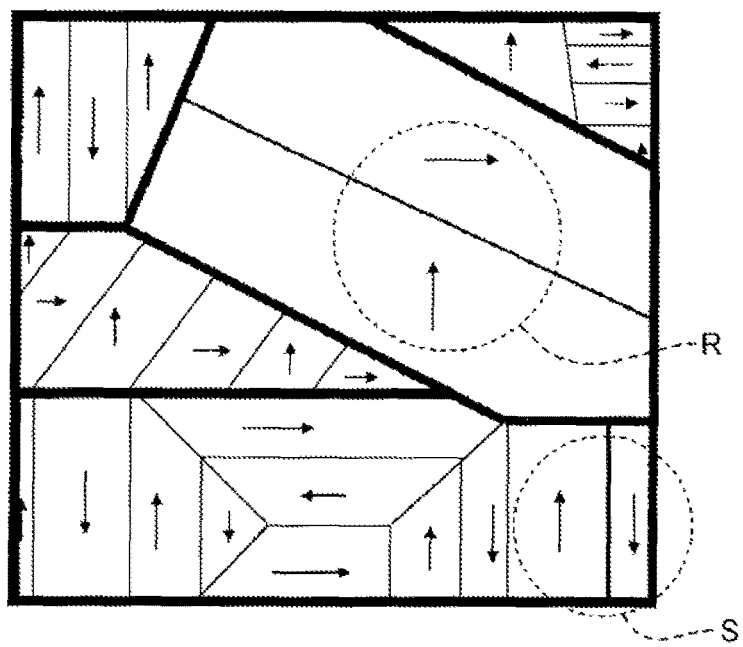
FIGS. 4A and 4B are diagrams showing polarization states of a PZT film for explaining 90° domain rotation.
Figure 4B:
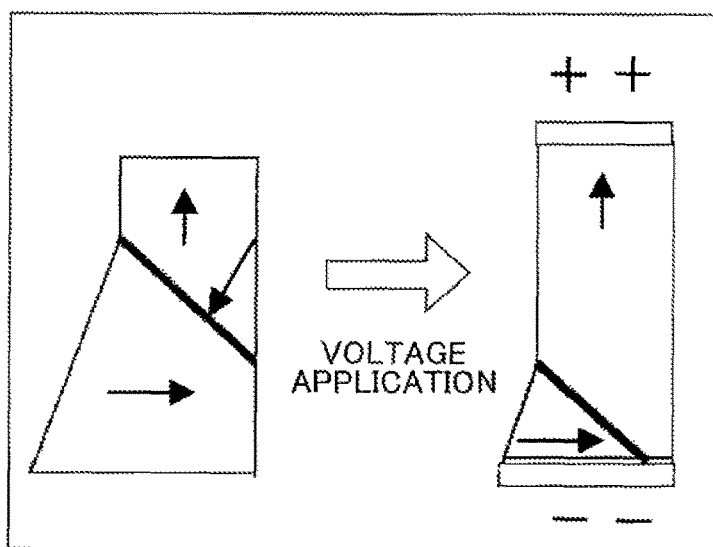

FIGS. 4A and 4B are diagrams showing polarization states of a PZT film for explaining 90° domain rotation. The arrows in FIGS. 4A and 4B indicate polarization directions. As shown in FIG. 4A, an actual crystal of the PZT film includes a number of domains having different polarization directions. Supposing that an electric field in a vertical direction in FIG. 4A is formed in the PZT film, a domain whose polarization direction is parallel to the vertical direction in FIG. 4A is an a-axis domain, and a domain whose polarization direction is a horizontal direction perpendicular to the vertical direction in FIG. 4A is a c-axis domain. Note that when a unit cell of the crystal is tetragonal, the a-axis length and the b-axis length are equal to each other, and only the c-axis length differs. When a unit cell of the crystal is tetragonal, the a-axis direction is equivalent to the b-axis direction, and a domain having spontaneous polarization of [100] direction, [010] direction, and their opposite directions is called an a-axis domain, and a domain having spontaneous polarization of [001] direction and its opposite direction is called a c-axis domain.

A boundary between domains of a crystal having different polarization directions is called a domain wall. Among such domain walls, there are a 90° domain wall in which an a-axis domain and an c-axis domain are separated by the domain wall as the boundary, and a 180° domain wall in which c-axis domains are separated by the domain wall as the boundary. In FIG. 4A, the region indicated by the dotted line "S" is a 180° domain wall structure, and the region indicated by the dotted line "R" is a 90° domain wall structure. In the region of the 180° domain wall structure, when an electric field is formed by applying voltage thereto, the polarization direction of the a-axis domain is reversed (180° domain rotation).

FIG. 4B is an enlarged diagram showing a polarization state of the region indicated by the dotted line "R" in FIG. 4A. In the region of the 90° domain wall structure, when an electric field in the a-axis direction is formed in the c-axis domain tetragonal structure, the polarization direction of the c-axis domain is changed to the a-axis direction, and the domain's polarization direction is rotated by 90° (90° domain rotation). The c-axis domain whose polarization direction is rotated by 90° is turned into an a-axis domain, and the domain wall as the boundary between the a-axis domain and the c-axis domain is moved.

The 90° domain rotation from the c-axis direction to the a-axis direction does not take place unless the c-axis domain is a domain within a 90° domain wall structure in contact with the a-axis domain. Namely, even if an electric field in the a-axis direction is formed in the region where the c-axis domains are adjacent to each other, 90° domain rotation does not occur. When the electric field is formed by applying voltage thereto, a distortion of the a-axis domain is first produced due to the piezoelectric effect, this distortion is transferred to the c-axis domain which adjoins the a-axis domain via the 90° domain wall, and the polarization direction of the c-axis domain is rotated to the electric field formation direction.

The amount of distortion caused by non-180° domain rotation such as 90° domain rotation is greater than the amount of distortion caused by the piezoelectric effect. Namely, if the electromechanical transducer element is capable of efficiently providing non-180° domain rotation, it is possible to increase the amount of distortion of the electromechanical transducer element. In the following, the effect of domain rotation refers to the effect of non-180° domain rotation.

It is known that the amount of distortion of the electromechanical transducer element when a PZT film with the diffraction intensity peak profile having a greatly asymmetric shape as shown in FIG. 3A is used is greater than that when a PZT film with the diffraction intensity peak profile having a less asymmetric shape as shown in FIG. 3B is used. This is because different crystal structures including tetragonal structure and rhombohedral structure coexist, making it possible to increase the density of non-180° domain walls, and making it possible to efficiently provide non-180° domain rotation.

The θ-2θ method is used to determine how the inter-planar spacing of the crystal at a certain point on the substrate surface is distributed in the thickness direction of the film. It is impossible for the θ-2θ method to determine how the inter-planar spacing of the crystal at a point minutely moved in the horizontal direction of the substrate surface from the certain point on the substrate surface is distributed in the thickness direction of the film. To make the determination, it is necessary to further perform the measurement according to the rocking curve method. Note that, when the rocking curve method is used, the angle (2θ) between the incidence angle of the X-ray and the detector is fixed in a position where the diffraction intensity by the measurement according to the θ-2θ method is the maximum, and the diffraction intensity is measured while only the angle (ω) between the incidence angle of the X ray and the sample substrate surface is changed minutely in the vicinity of θ.

The crystal growth direction of a film to be measured is not necessarily vertical to the substrate surface of the film. When the crystal growth direction of the film is not vertical to the substrate surface, the crystal plane is inclined to the substrate surface. In order to determine an amount of the inclination, it is necessary to perform measurement in which a tilt angle (χ) is changed in a position (2θ) where the diffraction intensity obtained by the measurement according to the θ-2θ method is the maximum. Note that, when a (lmn) plane (where l, m, n=0 or 1) of a crystal included in the electromechanical transducer film is inclined to a surface parallel to the (lmn) plane, the tilt angle (χ) is defined as an angle between the (lmn) plane and the inclined surface.

Figure 5A:
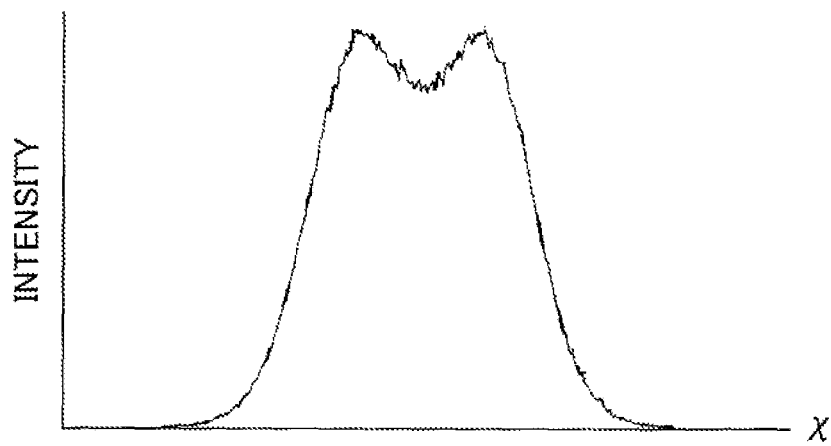
FIGS. 5A and 5B are graphs of an example diffraction intensity peak profile of a {100}-oriented PZT film obtained by measurement in which a tilt angle is changed, which can be separated into three peak profiles by peak separation.
Figure 5B:
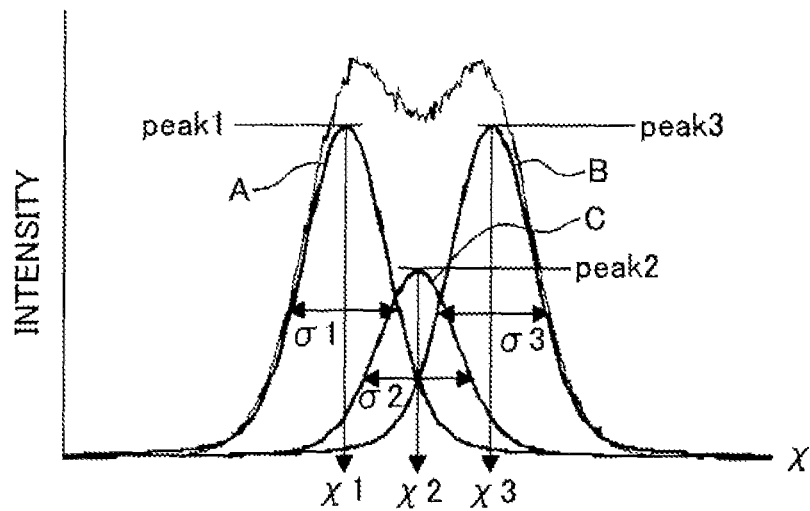

For a {100}-oriented PZT film, with which the degree of asymmetry of the shape of the diffraction intensity peak profile obtained by the measurement according to the X-ray diffraction θ-2θ method is found high as shown in FIG. 3A, the measurement in which the tilt angle is changed is further performed. The tilt angle is changed in a position (2θ) at which the diffraction intensity of the diffraction intensity peak profile corresponding to {200} plane is the maximum among the diffraction intensity peak profiles obtained by the measurement according to the θ-2θ method. FIGS. 5A and 5B are graphs of an example diffraction intensity peak profile of a PZT film obtained by the measurement in which the tilt angle is changed which can be separated into three peak profiles by peak separation. In FIGS. 5A and 5B, the ordinate indicates a diffraction intensity of a diffraction X-ray reflected from a measurement plane, and the abscissa indicates a tilt angle (χ).

In the diffraction intensity peak profile shown in FIG. 5A, a plurality of peak profiles corresponding to a plurality of crystal planes are superimposed into a single peak profile.

The diffraction intensity peak profile shown in FIG. 5A can be separated into three peak profiles "A", "B", and "C" by the peak separation as shown in FIG. 5B.

In the peak profiles "A", "B", and "C" shown in FIG. 5B, peak intensities in the position where the intensity of the corresponding peak profile is the maximum are set to peak1, peak2, and peak3, respectively. In the peak profiles "A", "B", and "C" shown in FIG. 5B, tilt angles at which the diffraction intensity of the corresponding peak profile is the maximum are set to χ1, χ2, and χ3, respectively. Further, half-value widths (χ) of the peak profiles "A", "B", and "C"

shown in FIG. 5B are set to σ1, σ2, and σ3, respectively. Here, a half-value width (χ) is a width of χ at which the diffraction intensity is equal to a value of half of the maximum of the diffraction intensity peak profile obtained by the measurement in which the tilt angle (χ) is changed.

The half-value width (χ) is an indicator for determining whether an amount of distortion of an electromechanical transducer element is sufficiently great. However, if a peak profile in which a plurality of peak profiles corresponding to a plurality of crystal planes are superimposed is treated as one peak profile without separating the peak profile, the amount of distortion of the electromechanical transducer element cannot be determined correctly. It is known by experiments that when peak profiles which cannot be separated into two or more peak profiles by the peak separation are compared with each other, the amount of distortion provided by the electromechanical transducer element due to the piezoelectric effect is comparatively great if the half-value width (χ) is comparatively small.

The half-value width (χ) of a peak profile in which a plurality of peak profiles corresponding to a plurality of crystal planes are superimposed cannot be used as the indicator for determining whether the amount of distortion of the electromechanical transducer element is sufficiently great. In this case, it is necessary to use, as the indicator for determining whether the amount of distortion of the electromechanical transducer element is sufficiently great, a weighted average FWHMstd(χ) (=(σ1×peak1+σ2×peak2+σ3×peak3)/(peak1+peak2+peak3)) of the peak intensities using the half-value widths σ1, σ2, and σ3 corresponding to the three peak profiles as weights.

Figure 6A:
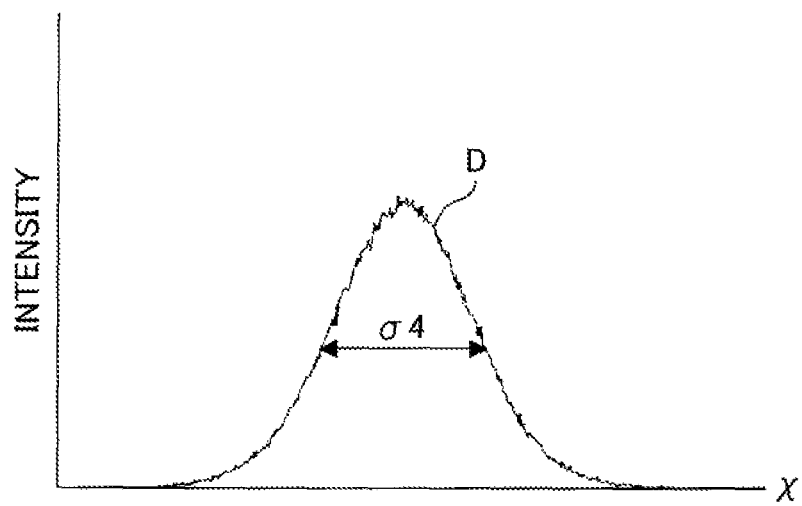
FIGS. 6A and 6B are graphs of example diffraction intensity peak profiles of a {100}-oriented PZT film obtained by the measurement in which the tilt angle is changed for explaining half-value widths of the diffraction intensity peak profiles.
Figure 6B:
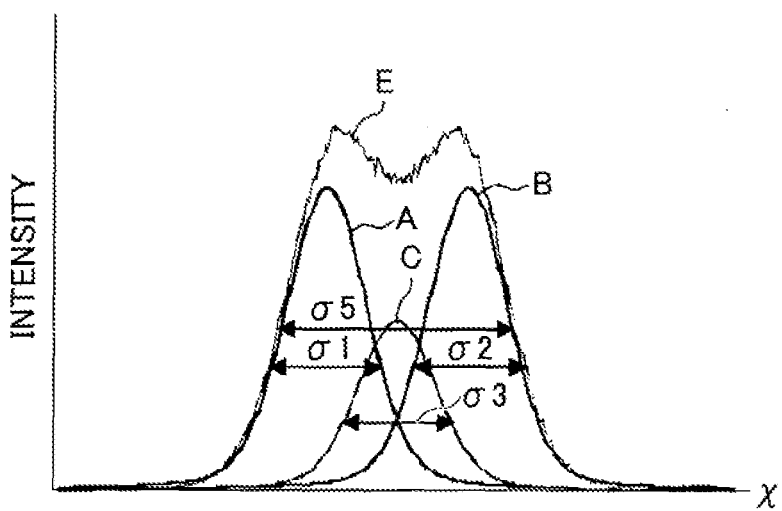

FIGS. 6A and 6B are graphs of example diffraction intensity peak profiles of a {100}-oriented PZT film for explaining the half-value widths of the diffraction intensity peak profiles obtained by the measurement in which the tilt angle is changed. FIG. 6A shows an example diffraction intensity peak profile obtained by the measurement in which the tilt angle is changed which cannot be separated into two or more peaks by the peak separation. FIG. 6B shows an example diffraction intensity peak profile obtained by the measurement in which the tilt angle is changed which can be separated into three peak profiles by the peak separation.

A half-value width σ4 of a peak profile D as shown in FIG. 6A is smaller than a half-value width σ5 of a peak profile E before the peak separation is performed as shown in FIG. 6B. However, it is confirmed that the amount of distortion of an electromechanical transducer element including a PZT film having the characteristics of the peak profile E due to the piezoelectric effect is greater than that of an electromechanical transducer element including a PZT film having the characteristics of the peak profile D. The weighted average FWHMstd(χ) of the half-value widths σ1, σ2, and σ3 of the peak profiles A, B, and C obtained by the peak separation of the peak profile E shown in FIG. 6B is smaller than the half-value width σ4 of the peak profile D shown in FIG. 6A. Hence, the weighted average FWHMstd (χ) may be used reliably as the indicator.

As the indicator, the weighted average described above is used rather than an arithmetic average of the half-value widths σ1, σ2, and σ3, because the diffraction intensities peak1, peak2, and peak3 affect the contributions of the crystal planes corresponding to the diffraction intensities to the amount of distortion of the electromechanical transducer element. For example, in a case of an electromechanical transducer element including a PZT film having a value of the peak1 corresponding to the peak profile indicated by "A" in FIG. 5B which is smaller than values of other peaks (peak2 and peak3), the ratio of the crystal planes corresponding to the peak profile indicated by "A" in FIG. 5B is lower than the ratio of the crystal planes corresponding to the other peak profiles. Hence, even if the half-value width of the peak profile indicated by "A" in FIG. 5B is greater than those of the other peak profiles, the contribution of the crystal planes corresponding to the peak profile indicated by "A" in FIG. 5B to the amount of distortion of the electromechanical transducer element is less than the contribution of the crystal planes corresponding to the other peak profiles.

It is preferable that FWHMstd(χ) is equal to or less than 12°. It is more preferable that FWHMstd(χ) is equal to or less than 8°. When FWHMstd(χ) is greater than 12°, sufficient distortion cannot be provided by the piezoelectric effect of the electromechanical transducer element.

The peak profile indicated by "B" in FIG. 5B corresponds to the crystal plane grown approximately in the vertical direction to the substrate surface (χ2≈0). The peak profiles indicated by "A" and "C" in FIG. 5B correspond to the crystal planes grown in the slanting directions which are inclined from the vertical direction to the substrate surface. A tilt angle of the crystal growth direction of the crystal plane corresponding to the peak profile indicated by "A" in FIG. 5B relative to the vertical direction to the substrate surface is represented by χ2-χ1. Similarly, a tilt angle of the crystal growth direction of the crystal plane corresponding to the peak profile indicated by "C" in FIG. 5B relative to the vertical direction to the substrate surface is represented by χ3-χ2. The greater the tilt angle of the crystal growth direction relative to the vertical direction to the substrate surface, the greater the amount of distortion of the crystal plane due to the effect of domain rotation.

An arithmetic average of |χ2-χ1| and |χ3-χ2| is represented by χstd (=(|χ2-χ1|+|χ3-χ2|)/2). It is preferable that χstd is in a range from 1° to 5°. It is more preferable that χstd is in a range from 1.5° to 3°.

When χstd is less than the lower limit (1°), the distortion of the crystal structure in the electromechanical transducer film becomes low. Hence, the effect of domain rotation becomes low and sufficient distortion is not provided by the electromechanical transducer element. On the other hand, when χstd is greater than the upper limit (5°), the amount of distortion of the electromechanical transducer element is increased considerably and a possibility that a failure, such as cracks, takes place due to the increased distortion of the crystal structure in the electromechanical transducer film is also increased. Hence, when the electromechanical transducer element is driven consecutively as the piezoelectric actuator, the amount of distortion after the consecutive driving is lowered from the amount of distortion in the initial state.

When χstd is in the above-described range, it is possible to increase sufficiently the amount of distortion of the electromechanical transducer element in the initial state, and it is possible to prevent the amount of distortion from being greatly lowered after the consecutive driving operation is performed.

For a {100}-oriented PZT film, with which the degree of asymmetry of the shape of the diffraction intensity peak profile obtained by the measurement according to the X-ray diffraction θ-2θ method is found high as shown in FIG. 3A, the measurement according to the locking curve method is further performed.

Figure 7A:
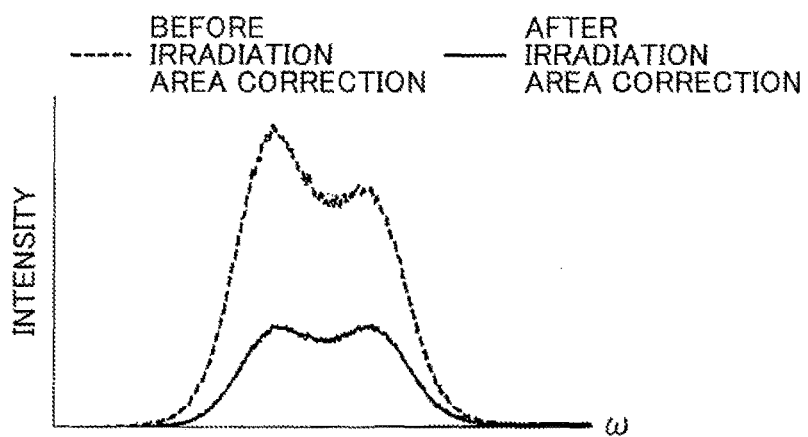
FIGS. 7A, 7B and 7C are graphs of an example diffraction intensity peak profile of a {100}-oriented PZT film obtained by measurement according to a locking curve method in a position where a diffraction intensity peak profile of a (200) plane obtained by the measurement according to the X-ray diffraction θ-2θ method is the maximum, which can be separated into three peak profiles by the peak separation.
Figure 7B:
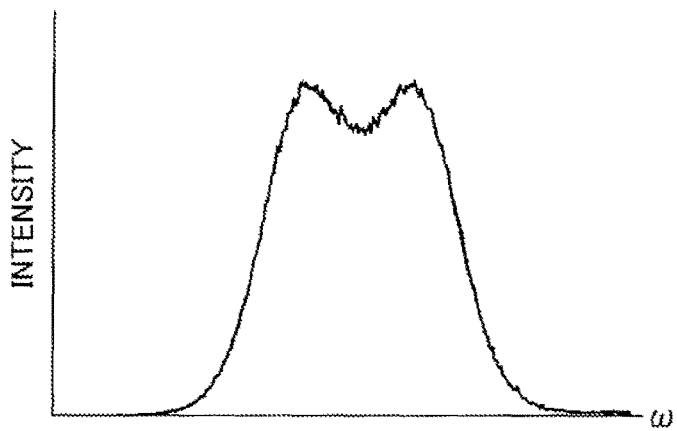
Figure 7C:
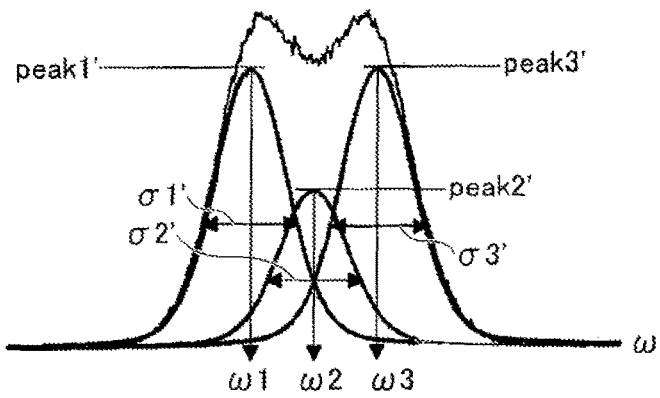

FIGS. 7A, 7B and 7C are graphs of an example diffraction intensity peak profile of a {100}-oriented PZT film obtained by the measurement according to the locking curve method in a position where a diffraction intensity peak profile of a (200) plane obtained by the measurement according to the X-ray diffraction θ-2θ method is the maximum, which can be separated into three peak profiles by the peak separation.

FIG. 7A shows an example diffraction intensity peak profile of the {200} plane of the PZT film obtained by the measurement according to the locking curve method. In FIGS. 7A, 7B and 7C, the ordinate indicates a diffraction intensity of a diffraction X-ray reflected from a measurement plane of the PZT film, and the abscissa indicates an incidence angle of the X-ray to the measurement plane of the PZT film.

In the peak profile shown in FIG. 7A, the diffraction intensity is likely to receive the influence of the irradiation area, and the irradiation area on the low angle side of the incidence angle ω is greater than the irradiation area on the high angle side of the incidence angle co. To eliminate this influence, it is necessary to multiply the peak profile by sin ω (or divide the same by cos ω) to correct the influence of the irradiation area (which will be called an "irradiation area correction"). FIG. 7B shows an example peak profile after the irradiation area correction is performed on the peak profile shown in FIG. 7A. In some cases, although the degree of asymmetry of the shape of the peak profile is high as shown in FIG. 7A, the degree of asymmetry of the shape of the peak profile after the irradiation area correction is performed is very low as shown in FIG. 7B.

FIG. 7C shows example peak profiles which are obtained by the peak separation of the peak profile after the irradiation area correction is performed shown in FIG. 7B. FIG. 7C shows that the peak profile shown in FIG. 7B can be separated into the three peak profiles by the peak separation. In the three peak profiles shown in FIG. 7C, peak intensities in a position where the intensity of the corresponding peak profile is the maximum are set to peak1', peak2', and peak3', respectively. Further, in the three peak profiles shown in FIG. 7C, half-value widths (ω) of the peak profiles are set to σ1', σ2', and σ3', respectively. Here, a half-value width (ω) is a width of ω at which the diffraction intensity is equal to a value of the half of the maximum of the diffraction intensity peak profile obtained by the measurement in which the incidence angle (ω) is changed.

Similar to the half-value width (χ) described above, the half-value width (ω) is an indicator for determining whether an amount of distortion of an electromechanical transducer element is sufficiently great. However, if a peak profile in which a plurality of peak profiles corresponding to a plurality of crystal planes are superimposed is treated as one peak profile without separating the peak profile, the amount of distortion of the electromechanical transducer element cannot be determined correctly. It is known by experiments that when peak profiles which cannot be separated into two or more peak profiles by the peak separation are compared with each other, the amount of distortion provided by the electromechanical transducer element due to the piezoelectric effect is comparatively great if the half-value width (ω) is comparatively small.

The half-value width (ω) of a peak profile in which a plurality of peak profiles corresponding to a plurality of crystal planes are superimposed cannot be used as the indicator for determining whether the amount of distortion of the electromechanical transducer element is sufficiently great. In this case, it is necessary to use, as the indicator for determining whether the amount of distortion of the electromechanical transducer element is sufficiently great, a weighted average FWHMstd(ω) (=(σ1'×peak1'+σ2'×peak2'+σ3'×peak3')/(peak1'+peak2'+peak3')) of the peak intensities using the half-value widths σ1', σ2', σ3' corresponding to the three peak profiles as weights.

It is preferable that FWHMstd(ω) is equal to or less than 10°. It is more preferable that FWHMstd(ω) is equal to or less than 6°. When FWHMstd(ω) is greater than 10°, sufficient distortion cannot be provided by the piezoelectric effect of the electromechanical transducer element.

In the peak profiles shown in FIG. 7C, angles between the sample substrate surface and an incidence angle of the X ray at which the diffraction intensity of the corresponding peak profile is the maximum are set to ω1, ω2, and ω3, respectively. An arithmetic average of (ω2−ω1) and (ω3−ω2) is represented by ωstd (=((ω2−ω1)+(ω3−ω2))/2). It is preferable that ωstd is in a range from 1° to 5°. It is more preferable that ωstd is in a range from 1.5° to 3°.

When ωstd is less than the lower limit (1°), the distortion of the crystal structure in the electromechanical transducer film becomes low. Hence, in this case, the effect of domain rotation becomes low and a sufficient amount of distortion is not provided by the electromechanical transducer element. On the other hand, when ωstd is greater than the upper limit (5°), the amount of distortion of the electromechanical transducer element is increased considerably and a possibility that failures, such as cracks, take place due to the increased distortion of the crystal structure of the electromechanical transducer film is also increased. Hence, when the electromechanical transducer element is driven consecutively as the piezoelectric actuator, the amount of distortion after the consecutive driving is lowered from the amount of distortion in the initial state.

When ωstd is in the above-described range, it is possible to increase sufficiently the amount of distortion of the electromechanical transducer element in the initial state, and it is possible to prevent the amount of distortion from being greatly lowered after the consecutive driving is performed.

It is known that a film formation temperature of the Pt film as the first electrode and a material of the base layer of the PZT film formed on the Pt film are important for suitable characteristics of the PZT film formed. The PZT film having the characteristics of the diffraction intensity peak profile described above with reference to FIG. 5B and FIG. 7C may be prepared by using the film formation temperature of the Pt film equal to or high than 300° C. and using $PbTiO_3$ as the material of the base layer of the PZT film. Further, when a $TiO_2$ film which is formed by thermal oxidation of a Ti film is used as an adhesion layer between a $SiO_2$ film as the diaphragm and a Pt film as the first electrode, a film thickness of the $TiO_2$ film is also important.

It is assumed that denotes a diffraction intensity of a diffraction intensity peak profile corresponding to a {hkl} plane where each of h, k and l is an integer, ΣI denotes a sum (total diffraction intensity) of diffraction intensities of the diffraction intensity peak profiles corresponding to the planes from which the diffraction intensity peak profiles are obtained by the measurement, and ρ{hkl} denotes a ratio of I{hkl} and ΣI (ρ{hkl}=I{hkl}/ΣI). The ratio ρ{hkl} indicates an orientation ratio of the {hkl} plane. It is preferable that ρ{100} is equal to or greater than 0.75. It is more preferable that ρ{hkl} is equal to or greater than 0.85. When ρ{hkl} is less than 0.75, the amount of distortion due to the piezoelectric effect becomes insufficient and sufficient distortion cannot be provided by the electromechanical transducer element.

Figure 8:
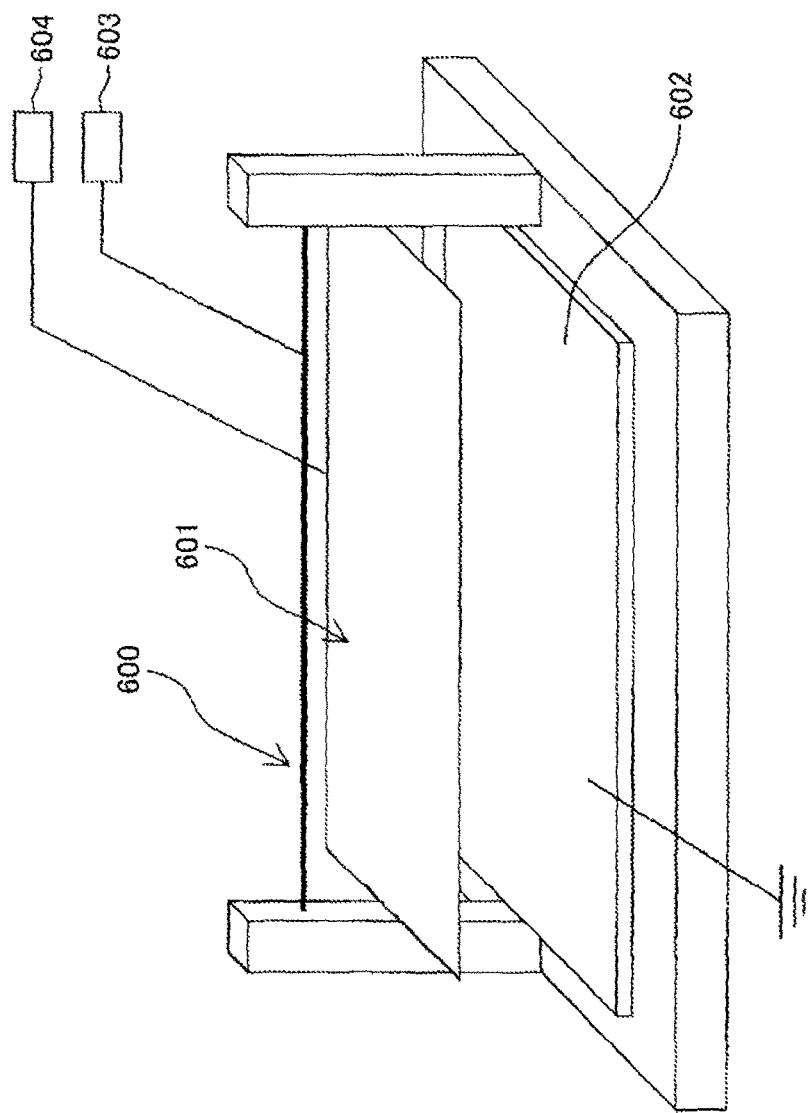
FIG. 8 is a perspective view of an example of a main part of a polarization processing device.

Next, a polarization process is performed for the prepared piezoelectric element using a polarization processing device. FIG. 8 schematically shows an example of the polarization processing device. As shown in FIG. 8, the polarization processing device includes a corona electrode 600, a grid electrode 601, and a sample stage 602 for placing a sample. The corona electrode 600 is connected to a corona electrode power source 603, and the grid electrode 601 is connected to a grid electrode power source 604. The sample stage 602 is configured to have a temperature adjustment function. By using the temperature adjustment function of the sample stage 602, the polarization process may be performed by applying a temperature to the sample up to 350° C. at the highest. A ground line is connected to the sample stage 602. A meshing process is performed on the grid electrode 601 so that when a high voltage is applied to the corona electrode 600, ions and charges generated by corona discharge of the corona electrode 600 may effectively fall onto the sample stage 602. It is possible to adjust the intensity of the corona discharge by changing the distance between the sample and the electrodes or changing the voltage applied to the corona electrode 600 or the grid electrode 601.

Figure 9A:
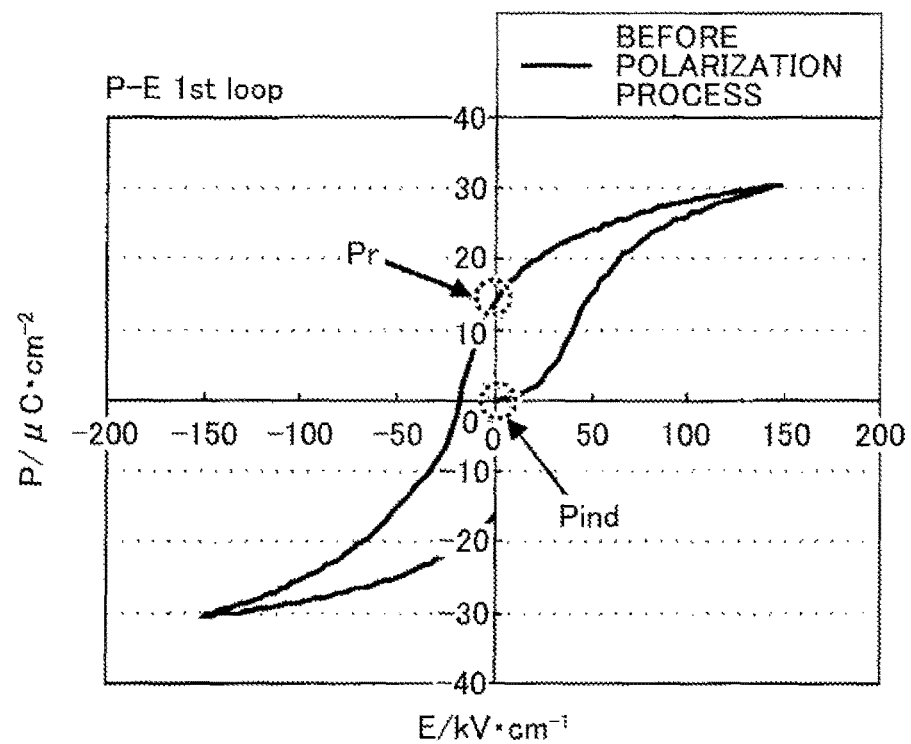
FIG. 9A is a graph of an example P-E hysteresis loop before the polarization process is performed.
Figure 9B:
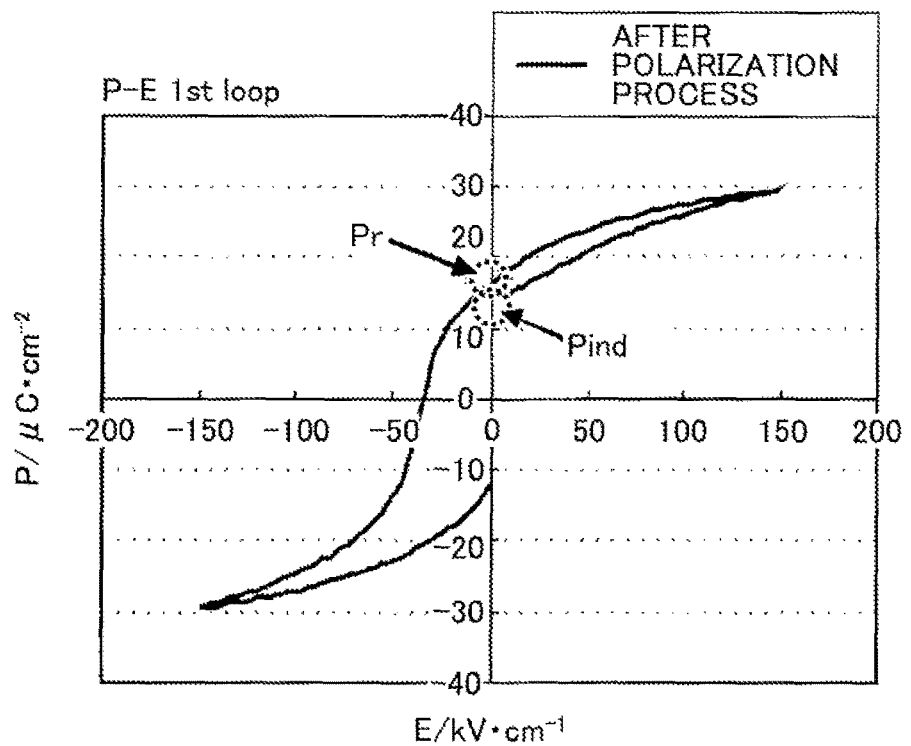
FIG. 9B is a graph of an example P-E hysteresis loop after the polarization process is performed.

The state of the polarization by the polarization process is determined based on the P-E hysteresis loop shown in FIGS. 9A and 9B. FIG. 9A shows an example P-E hysteresis loop before the polarization process is performed. FIG. 9B shows an example P-E hysteresis loop after the polarization process is performed. As shown in FIGS. 9A and 9B, the hysteresis loop is measured by applying electric field intensity of ±150 kV/cm to the electromechanical transducer film. A value of (Pr−Pind) is defined as the polarizability, where "Pind" denotes the polarization upon the initial voltage of 0 kV/cm, and "Pr" denotes the polarization when the voltage is 0 kV/cm after the voltage of +150 kV/cm is applied and the voltage is returned to 0 kV/cm. Based on the polarizability (the value of (Pr−Pind)), it is determined whether the polarization state is good.

As shown in FIG. 9A, the polarizability before the polarization process is performed is approximately 15 µC/cm², and as shown in FIG. 9B, the polarizability after the polarization process is performed is approximately 2 µC/cm². It is preferable that the polarizability is less than or equal to 10 µC/cm². It is more preferable that the polarizability is less than or equal to 5 µC/cm². When the polarizability does not satisfy the value, it becomes difficult to provide sufficient characteristics for prevention of distortion degradation after consecutive driving as the PZT piezoelectric actuator. A desired polarizability can be obtained by adjusting the intensity of the corona discharge by the above-described method.

Figure 10:
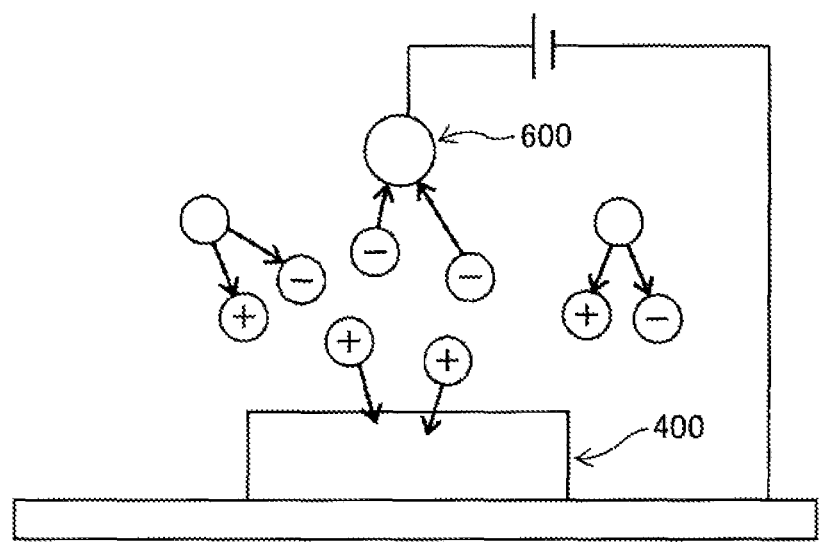
FIG. 10 is a diagram for explaining discharge from a corona electrode.

As shown in FIG. 10, when corona discharge is conducted using the corona electrode 600, cations are generated by ionizing molecules of the atmospheric air. The cations flow through the electromechanical transducer element 400 so that charges are accumulated in the electromechanical transducer element 400. In the electromechanical transducer element 400 shown in FIG. 1, it is conceivable that the polarization process is performed due to a potential difference between the upper and lower surfaces of the electromechanical transducer element generated by the difference of the electric charges accumulated in the first electrode 405 as the lower electrode and in the second electrode 407 as the upper electrode. It is preferable that the amount Q of the electric charges required for the polarization process is greater than or equal to 1E-8 C. It is more preferable that the amount Q of the electric charges required for the polarization process is greater than or equal to 4E-8 C. If the amount Q of the electric charges is less than 1E-8 C, the polarization process is not fully performed, and when the electromechanical transducer element is used as the actuator and driven consecutively, sufficient distortion cannot be provided by the electromechanical transducer element.

Next, examples of liquid droplet discharge heads in which the electromechanical transducer element according to the invention is incorporated and a comparative example will be described.

Example 1

A SiO₂ film (film thickness: approximately 1.0 µm) as a diaphragm was formed on a 6-inch silicon wafer as a substrate. A Ti film (film thickness: approximately 20 nm) was formed on the SiO2 film at the film formation temperature of 350° C. with a sputtering device. Then, the Ti film was thermally oxidized at the temperature of 750° C. by an RTA (rapid thermal annealing) process. Subsequently, a Pt film (film thickness: approximately 160 nm) as a first electrode (lower electrode) was formed at the temperature of approximately 300° C. with a sputtering device. The TiO₂ film formed by the thermal oxidation of the Ti film serves as an adhesion layer between the SiO₂ film and the Pt film.

Subsequently, a PT application liquid was prepared by the composition ratio of Pb:Ti=1:1 as a material of a PbTiO₃ (PT) layer which is a first oxide layer as a base layer of a PZT film. Further, a PZT precursor application liquid was prepared. This application liquid was prepared by the composition ratio of Pb:Zr:Ti=115:49:51 as the material of the PZT film. More specifically, the PZT precursor application liquid was prepared as follows. First, lead acetate trihydrate, isopropoxide titanium, and isopropoxide zirconium were used as the starting materials. The crystal water of the lead acetate was dissolved in methoxyethanol and then dehydrated. The amount of lead was excessive relative to the stoichiometric composition. This is because of the prevention of reduction of the crystallinity due to a so-called lead removal phenomenon during heating. Isopropoxide titanium and isopropoxide zirconium were dissolved in methoxyethanol, and an alcohol exchange reaction and an esterification reaction were proceeded with, and mixed with the methoxyethanol in which lead acetate was dissolved to prepare the PZT precursor solution. The PZT concentration was arranged to be 0.5 mol/l. The PT application liquid was prepared similar to the PZT precursor application liquid described above.

Using these application liquids, a PT film was formed with a spin coater. After that, the PT film was dried at the temperature of 120° C. with a hot plate, and then thermally decomposed at the temperature of 400 V. The application of the PZT precursor application liquid, the drying, and the thermal decomposition were repeated 3 times, and three layers were formed. After the thermal decomposition was performed on the third layer, a crystallization heat treatment was performed at the temperature of 730° C. by an RTA (rapid thermal annealing) process. The film thickness of the PZT film at the end of the crystallization heat treatment was 240 nm. This process was conducted eight cycles (24 layers) to form a PZT film having the film thickness of approximately 2.0 µm.

Next, a SrRuO3 film (film thickness: 40 nm) as a second oxide layer and a Pt film (film thickness: 125 nm) as a second electrode (upper electrode) were formed on the PZT film by a sputtering method. After that, a photoresist (TSMR8800) produced by Tokyo Ohka Kogyo Co., Ltd. was formed by a spin coater. After that, a pattern was formed by photolithography and etching by using an ICP etching device produced by Samco Inc.

Next, after the pattern formation, an $Al_2O_3$ film (film thickness: 50 nm) as a first insulation protection film was formed by an ALD method. As source materials of the $Al_2O_3$ film, Al which was based on TMA (Signaldrich Co.) and $O_3$ which was generated by an ozone generator were used. Al and $O_3$ were alternately laminated and the film formation of the $Al_2O_3$ film was proceeded with. After that, a contact hole section was formed in the first insulation protection film by etching. Then, Al films as a fifth electrode and a sixth electrode were formed by a sputtering method, patterning was performed by photolithography and etching, and a $Si_3N_4$ film (film thickness: 500 nm) as a second insulation protection film was formed by a plasma CVD method. Finally, the pressure chamber was formed in the substrate by anisotropic wet etching using an alkali solution (a KOH or TMHA solution). Hence, the liquid droplet discharge head including the piezoelectric actuator (the thin film PZT actuator) as the electromechanical piezoelectric element is formed.

After that, a polarization process was performed by a corona charging process. To perform the corona charging process, a tungsten wire having a diameter of 50 μm was used. The polarization process conditions were: a processing temperature 80 V, a corona voltage 9 kV, a grid voltage 2.5 kV, a processing time 30 s, a distance between corona electrode and grid electrode 4 mm, and a distance between grid electrode and stage 4 mm. Further, a distance between the two sixth electrode pads was set to 80 μm.

Example 2

A liquid droplet discharge head similar to the liquid droplet discharge head of Example 1 was formed by the same method except that the film thickness of the Ti film formed on the $SiO_2$ film as the diaphragm was set to approximately 50 nm, and the thermal decomposition temperature after the film formation of the PZT film was set to 350 V.

Example 3

A liquid droplet discharge head similar to the liquid droplet discharge head of Example 1 was formed by the same method except that the film thickness of the Ti film formed on the $SiO_2$ film as the diaphragm was set to approximately 50 nm, the film formation temperature was 500 V, and the thermal decomposition temperature after the film formation of the PZT film was set to 350 V.

Example 4

A liquid droplet discharge head similar to the liquid droplet discharge head of Example 1 was formed by the same method except that the film formation temperature of the Ti film formed on the SiO2 film as the diaphragm was set to 500 V, the drying temperature after the film formation of the PZT film was set to 140 V, and the thermal decomposition temperature was set to 350 V.

Example 5

A liquid droplet discharge head similar to the liquid droplet discharge head of Example 1 was formed by the same method except that the film thickness of the Ti film formed on the $SiO_2$ film as the diaphragm was set to approximately 50 nm, and the film formation temperature was set to 500 V.

Example 6

A liquid droplet discharge head similar to the liquid droplet discharge head of Example 1 was formed by the same method except that the film formation temperature of the Ti film formed on the $SiO_2$ film as the diaphragm was set to 500 V, and the drying temperature after the film formation of the PZT film was set to 140 V.

Comparative Example 1

A liquid droplet discharge head similar to the liquid droplet discharge head of Example 1 was formed by the same method except that a $TiO_2$ layer having a film thickness of 5 nm as a base layer was formed by a sputtering method, instead of the $PbTiO_3$ layer as the first oxide layer, after the film formation of the Ti film formed on the $SiO_2$ film as the diaphragm.

For the liquid droplet discharge heads of Examples 1-6 and Comparative Example 1 in which the back surfaces of the substrates are etched, an evaluation measurement was performed to determine the amount of distortion (piezoelectric constant) in the initial state of the electromechanical transducer element and the state immediately after the endurance test. In the endurance test, the voltage application was repeated $10^{10}$ times after the evaluation of the initial piezoelectric constant. The piezoelectric constant was computed by combining a measurement result of an amount of distortion or deformation of the electromechanical transducer element from the back surface of the substrate when an electric field of 150 kV/cm is formed by the voltage application using a laser Doppler vibration meter and simulation results. Further, for the PZT films of Examples 1-6 and Comparative Example 1 in which the back surfaces of the substrates were etched, the crystalline characteristics were evaluated using the X-ray diffraction.

In Examples 1-6 and Comparative Example 1, the orientation ratio of the {100} plane of each PZT film obtained by the measurement according to the X-ray diffraction θ-2θ method was equal to or greater than 80%. Namely, it was confirmed that each of the PZT films of Examples 1-6 and Comparative Example 1 is a {100}-oriented PZT film.

The results of the diffraction intensity analysis of the PZT films of the electromechanical transducer elements of Examples 1-6 and Comparative Example 1 obtained by the measurement in which the tilt angle is changed and by the measurement according to the locking curve method are shown in TABLE 1 below. With respect to Examples 1-6, it was possible to perform the peak separation into three peak profiles of all of the diffraction intensity peak profiles obtained by the measurement in which the tilt angle is changed and by the measurement according to the locking curve method. On the other hand, with respect to Comparative Example 1, it was impossible to perform the peak separation of the diffraction intensity peak profiles obtained by the measurement in which the tilt angle is changed and by the measurement according to the locking curve method (one peak profile).

FWHMstd($\chi$) of each of the electromechanical transducer elements of Examples 1-6 and Comparative Example 1 was computed based on the diffraction intensity peak profile obtained by the measurement in which the tilt angle is changed by using the above-described analysis method. Further, FWHMstd($\omega$) of each of the electromechanical transducer elements of Examples 1-6 and Comparative Example 1 was computed based on the diffraction intensity peak profile obtained by the measurement according to the locking curve method by using the above-described analysis method. Further, χstd and ωstd of each of the electromechanical transducer elements of Examples 1-6 were computed. The piezoelectric constant of each of the electromechanical transducer elements of Examples 1-6 and Comparative Example 1 in the initial state and the piezoelectric constant thereof immediately after the endurance test (in which the voltage is applied $10^{10}$ times) were measured. These results of the analysis and measurement are shown in TABLE 1 below.

TABLE 1

|  | FWHMstd(χ) | χstd | FWHMstd(ω) | ωstd | Piezoelectric Constant d31 (pm/V) | |
|---|---|---|---|---|---|---|
|  |  |  |  |  | Initial | After $10^{10}$ |
| Example 1 | 6.9 | 2.4 | 5.4 | 2.2 | −144 | −141 |
| Example 2 | 11.4 | 1.7 | 9.9 | 1.5 | −139 | −135 |
| Example 3 | 8.3 | 3.6 | 7.5 | 3.8 | −154 | −143 |
| Example 4 | 8.0 | 4.5 | 7.1 | 4.7 | −158 | −144 |
| Example 5 | 6.2 | 2.7 | 5.7 | 2.9 | −146 | −137 |
| Example 6 | 5.3 | 2.3 | 4.8 | 2.4 | −140 | −135 |
| Comparative Example 1 | 12.1 | 0 | 10.3 | 0 | −120 | −114 |

For each of the electromechanical transducer elements of Examples 1-6, FWHMstd(χ) was equal to or less than 12°. For each of the electromechanical transducer elements of Examples 1-6, χstd was in a range from 1° to 5°. On the other hand, for the electromechanical transducer element of Comparative Example 1, FWHMstd(χ) was equal to 12.1° which exceeded 12°.

For each of the electromechanical transducer elements of Examples 1-6, FWHMstd(ω) was equal to or less than 10°. For each of the electromechanical transducer elements of Examples 1-6, ωstd was in a range from 1 to 5°. On the other hand, for the electromechanical transducer element of Comparative Example 1, FWHMstd(χ) was equal to 10.3° which exceeded 10°.

For each of the electromechanical transducer elements of Examples 1-6, the piezoelectric constant in the initial state and the piezoelectric constant immediately after the endurance test were in a range from −120 μm/V to −160 μm/V. When the piezoelectric constants are in this range, the electromechanical transducer elements are equivalent to generally used ceramic sintered bodies, and the amount of distortion demanded for practical electromechanical transducer elements may be provided. On the other hand, for the electromechanical transducer element of Comparative Example 1, the piezoelectric constant in the initial state and the piezoelectric constant immediately after the endurance test were below −120 μm/V.

The initial piezoelectric constants of Examples 3 and 4 were greater than those of other Examples. On the other hand, the degradation ratio of the after-endurance-test piezoelectric constant to the initial piezoelectric constant (=(the initial piezoelectric constant−the after-endurance-test piezoelectric constant)/the initial piezoelectric constant) of each of Examples 3 and 4 was slightly higher than those of other Examples. Therefore, it is preferable that FWHMstd(χ) is equal to or less than 8° and χstd is in a range from 1.5° to 3°. Further, it is preferable that FWHMstd(ω) is equal to or less than 6° and ωstd is in a range from 1.5° to 3°.

However, the after-endurance-test piezoelectric constants of Examples 1-6 (including Examples 3 and 4) were almost the same value. Namely, it was confirmed that when FWHMstd(χ) is equal to or less than 12° and χstd is in a range from 1° to 5°, it is possible to increase the initial piezoelectric constant sufficiently and it is possible to maintain a suitable piezoelectric constant after the electromechanical transducer element is consecutively driven as the actuator. Further, it is preferable that FWHMstd(ω) is equal to or less than 10°, and ωstd is in the range from 1° to 5°. It was confirmed that when FWHMstd(ω) is in a range from 2° to 8°, it is possible to increase the initial piezoelectric constant sufficiently and it is possible to maintain a suitable piezoelectric constant after the electromechanical transducer element is driven consecutively as the actuator.

Next, an example configuration of a liquid droplet discharge head having plural nozzles according to an embodiment in which the piezoelectric actuator including the PZT film is incorporated will be described.

Figure 11:
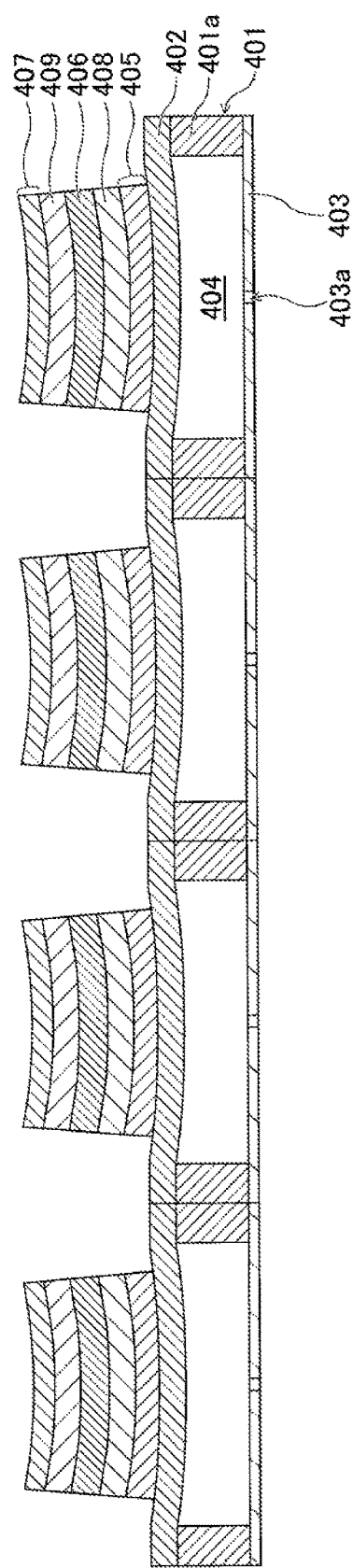
FIG. 11 is a cross-sectional view of an example configuration of a liquid droplet discharge head according to an embodiment.

FIG. 11 is a cross-sectional view of an example configuration of the liquid droplet discharge head according to the embodiment in which the piezoelectric actuator including the PZT film 406 shown in FIG. 1 is incorporated. According to the configuration of FIG. 11, the piezoelectric actuator which is implemented by the electromechanical transducer element may be formed by a simplified manufacturing process and the piezoelectric actuator may have a discharging performance equivalent to that of bulk ceramics. Further, the liquid droplet discharge head having the plural nozzles may be formed by etching removal from the rear surface to form the pressure chamber and bonding a nozzle plate having nozzle holes. In FIG. 11, the illustrations of a liquid supply unit, a flow path, and a flow resistance are omitted.

The liquid droplet discharge head shown in FIG. 11 was formed using the electromechanical transducer element of each of Examples 1-6, and ink discharge evaluation was performed on the liquid droplet discharge head. In this evaluation, the ink whose viscosity was adjusted to 5 cp is used, the voltage of −10 V to −30 V was applied according to a simple push waveform, and a discharging state of the ink from the nozzle holes was checked. As a result, it was confirmed that each of Examples 1-6 can provide good discharging characteristics of the ink from all the nozzle holes.

Next, an inkjet recording device which is an image forming apparatus incorporating the liquid droplet discharge head according to the embodiment will be described.

Figure 12:
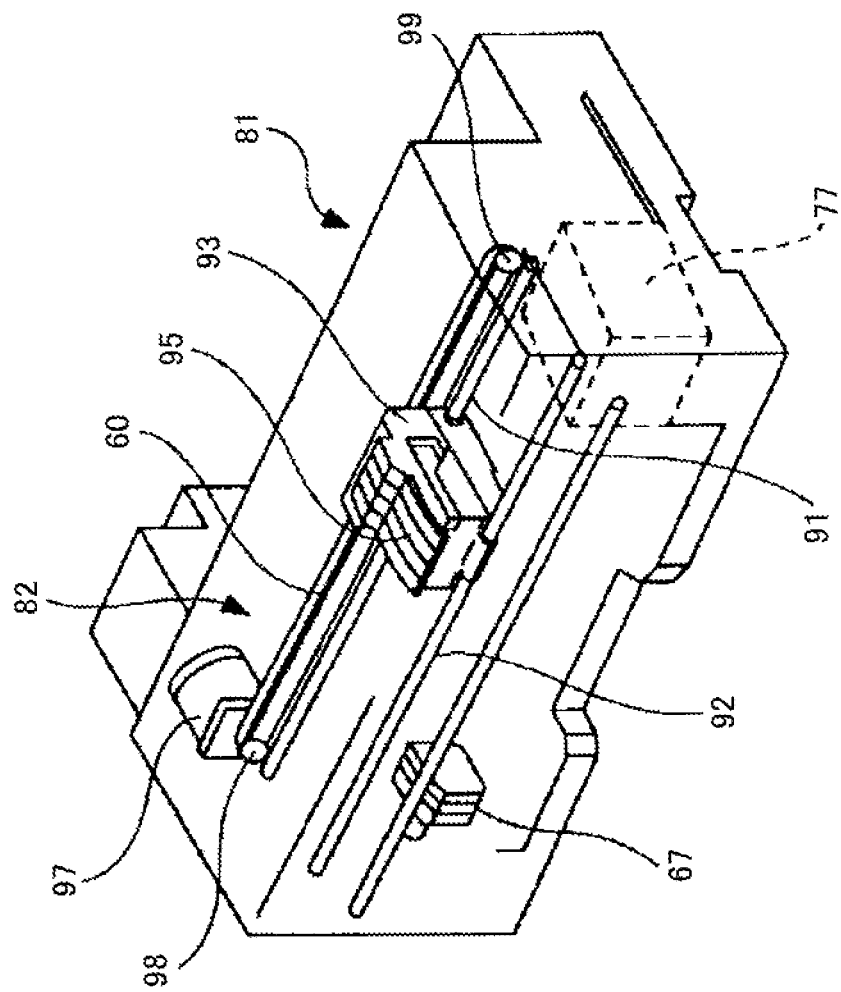
FIG. 12 is a perspective view of an inkjet recording device using the liquid droplet discharge head according to an embodiment.
Figure 13:
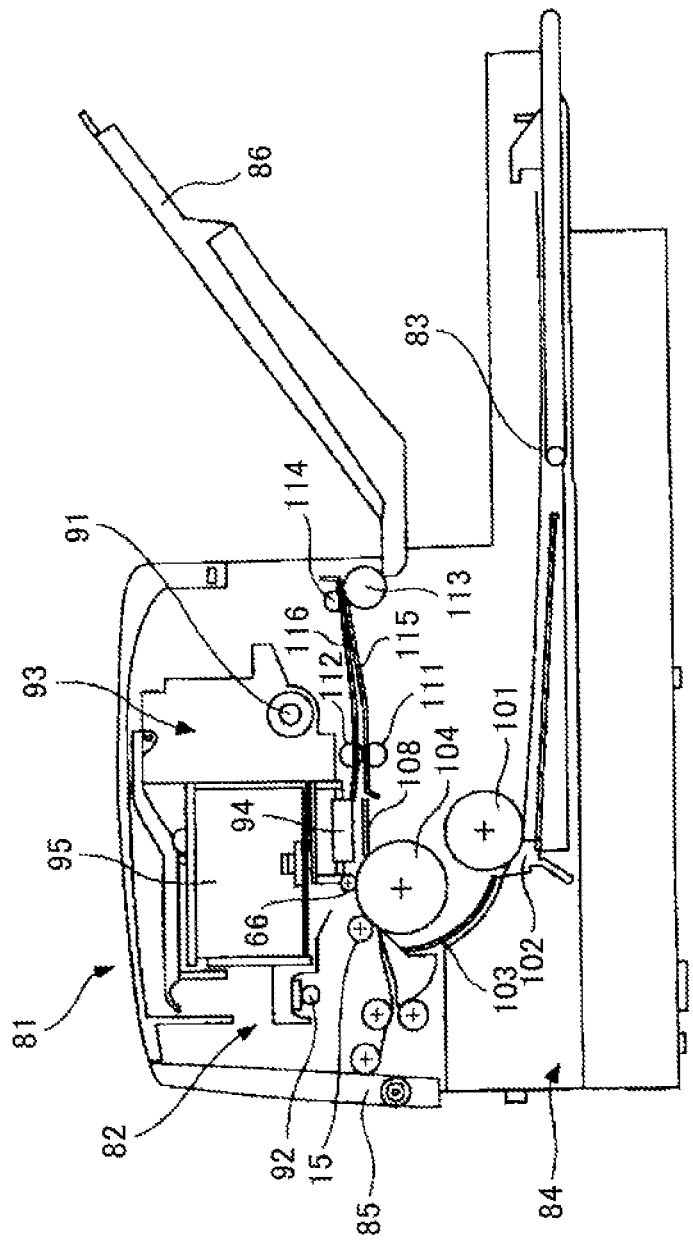
FIG. 13 is a cross-sectional view of the inkjet recording device according to the embodiment.

FIG. 12 is a perspective diagram showing an example of an inkjet recording device according to an embodiment. FIG. 13 is a cross-sectional view of the inkjet recording device according to the embodiment.

As shown in FIGS. 12 and 13, the inkjet recording device according to the embodiment includes a recording device main body 81 and a printing mechanical section 82 which is housed in the recording device main body 81. The printing mechanical section 82 includes a carriage 93 which is movable in a main scanning direction, a liquid droplet discharge head 94 mounted on the carriage 93, and an ink cartridge 95 for supplying ink to the liquid droplet discharge head 94 (which is a liquid cartridge for supplying liquid for image formation to the liquid droplet discharge head). Further, a sheet feeding cassette (or a sheet supply tray) 84 on which a number of sheets 83 can be stored is provided in a manner such that the sheet feeding cassette 84 is detachably attached to the lower part and the front side of the recording device main body 81. Further, a manual tray 85 may be open and set, so that a sheet 83 may be taken into the liquid droplet discharge head 94 from the sheet feeding cassette 84 or the manual tray 85. Then, a desired image is recorded on the sheet 83 by the printing mechanical section 82 and the sheet 83 is ejected to an ejection tray 86 disposed on the rear surface side of the inkjet recording device.

The printing mechanical section 82 includes a main rod 91, a sub rod 92, and the carriage 93. The main rod 91 and the sub rod 92 are guide members which bridge between left and right side plates, slidably supporting the carriage 93 in the main scanning direction. The carriage 93 has the liquid droplet discharge head 94 which discharges yellow (Y), cyan (C), magenta (M), and black (Bk) ink droplets. The liquid droplet discharge head 94 has plural ink discharge openings (i.e., nozzles) arranged in the direction crossing with the main scanning direction and whose ink droplet discharge direction is downward. Further, in the carriage 93, yellow (Y), cyan (C), magenta (M), and black (Bk) ink cartridges 95 are exchangeably mounted, which supply yellow (Y), cyan (C), magenta (M), and black (Bk) ink, respectively, to the liquid droplet discharge head 94.

The ink cartridge 95 includes an air opening in communication with air on the upper side thereof, a supply opening to supply ink to the liquid droplet discharge head 94 on the lower side thereof, and a porous body in which ink is stored, so that a slight negative pressure is kept in the ink to be supplied to the liquid droplet discharge head 94 by the capillary force of the porous body. Here, a case where four liquid droplet discharge heads 94 for the respective colors are provided as a recording head is described. However, a single liquid droplet discharge head having nozzles to discharge ink droplets of the respective color may be used.

Here, the carriage 93 is slidably engaged with the main rod 91 on the rear side (downstream side in the sheet conveying direction), and is slidably mounted on the sub rod 92 on the front side (upstream side in the sheet conveying direction). Further, in order to move the carriage 93 to scan in the main scanning direction, a timing belt 60 is stretched between a drive pulley 98 (which is rotated by a main scanning motor 97) and a driven pulley 99. The timing belt 60 is fixed to the carriage 93, so that the carriage 93 is driven back and forth in accordance with forward and backward rotation of the scanning motor 97.

On the other hand, in order to feed the sheet 83 set in the sheet feeding cassette 84 to the lower side of the head 94, there are a sheet feed roller 101 and a friction pad 102 to separate and feed the sheet 83 from the sheet feeding cassette 84, a guide member 103 to guide the sheet 83, a feed roller 104 to invert the fed sheet 83 and feed the inverted sheet 83, a feed roller 15 to be pressed to the peripheral surface of the feed roller 104, and a head roller 66 to define the feed angle of the sheet 83 from the feed roller 104. The feed roller 104 is driven to rotate by a sub-scanning motor 67 via a gear train.

A print receive member 108 is provided which is a sheet guide member to guide the sheet 83 fed from the feed roller 104 to the lower side of the liquid droplet discharge head 94 in accordance with the moving range of the carriage 93 in the main scanning direction. On the downstream side of the print receive member 108 in the sheet conveying direction, there are provided a feeding roller 111 which is rotatably driven to feed the sheet 83 to the sheet ejection direction and a spur roller 112. Further, there are provided a sheet ejection roller 113 and a spur roller 114 to feed the sheet 83 to the ejection tray 86, and guide members 115 and 116 to form the sheet ejection path.

At the time of recording, while the carriage 93 is moved and the liquid droplet discharge head 94 is driven in accordance with the image signal, ink is discharged to the sheet 83 which is stopped to record one line. After the sheet 83 is moved by a predetermined feed distance, the next line is recorded on the sheet 83. When a record end signal or a signal indicating that the tail end of the sheet 83 reaches the recording area is received, the recording operation is terminated and the sheet 83 is ejected.

Further, a recovery device 77 to recover from a discharge failure of the liquid droplet discharge head 94 is disposed at a right end portion of the carriage 93 in the moving direction which is separate from the recording area. The recovery device 77 includes a capping unit, a suction unit, and a cleaning unit. In a print waiting period, the carriage 93 is moved on the recovery device 77 side, so that the liquid droplet discharge head 94 on the carriage 93 is capped by the capping unit of the recovery device 77 to keep the discharge openings (nozzles) under moisture conditions to prevent the discharge failure due to ink drying. Further, during printing, ink irrelevant to printing is discharged so that the ink viscosity is to be constant throughout all the discharge openings to maintain a stable discharge performance.

In case of a discharge failure, the discharge openings (nozzles) of the liquid droplet discharge head 94 are sealed by the capping unit, ink and bubbles and the like are suctioned from the discharge openings by the suction unit through a tube, and ink, dust and the like are removed from the discharge openings by the cleaning unit, so as to recover from the discharge failure. Further, the suctioned ink is discharged to a waste ink reservoir (not shown) disposed on the lower side of the recording device main body 81 and absorbed and stored into an ink absorber in the waste ink reservoir. The above-described inkjet recording device is configured by incorporating the liquid droplet discharge head prepared according to the above-described embodiment and Examples 1-6. Thus, a discharge failure of ink droplets due to insufficient driving of the diaphragm does not occur, stable discharge characteristics can be provided and the image quality can improve.

In the above-described embodiment, when the diffraction intensity peak profile of the {100}-oriented PZT film obtained by the measurement in which the tilt angle is changed in a position (2θ) where the diffraction intensity of the peak profile obtained by the measurement according to the θ-2θ method is the maximum shows the characteristic that the peak profile can be separated into some peak profiles by the peak separation, the amount of distortion of the electromechanical transducer element can be increased. However, this is not limited to the above-described embodiment. Also, in a case of a electromechanical transducer film having a {n00}-oriented perovskite crystal structure (where n is a positive integer), the same features can be provided. That is, when the diffraction intensity peak profile obtained by the measurement in which the tilt angle is changed in a position (2θ) where the diffraction intensity of the diffraction intensity peak profile corresponding to a {N00} plane (where N is a positive integer) parallel to the {n00} plane of the PZT film is the maximum shows the characteristic that the peak profile can be separated into some peak profiles by the peak separation, the amount of distortion of the electromechanical transducer element can be increased.

As described in the foregoing, in the electromechanical transducer element according to the invention, sufficient distortion may be provided by an electromechanical transducer film having a perovskite crystal structure.

The electromechanical transducer element according to the present invention is not limited to the above-described embodiments, and variations and deformations may be made without departing from the scope of the present invention.

What is claimed is:

1. An electromechanical transducer element comprising:
   a lower electrode formed directly or indirectly on one of a substrate and a base layer;
   an electromechanical transducer film of a piezoelectric material formed on the lower electrode, the electromechanical transducer film having a {100}-oriented perovskite crystal structure; and
   an upper electrode formed on the electromechanical transducer film,
   wherein the electromechanical transducer film has characteristics such that a diffraction intensity peak profile of the film obtained by measurement in which a tilt angle ($\chi$) is changed, in a position (2θ) where a diffraction intensity of a diffraction intensity peak profile corresponding to a {200} plane among diffraction intensity peak profiles of the film obtained by measurement according to an X-ray diffraction θ-2θ method is the maximum, is capable of being separated into three peak profiles by peak separation, and when peak intensities of the three peak profiles are set to peak1, peak2, and peak3 and half-value widths of the three peak profiles are set to σ1, σ2, and σ3, a weighted average FWHMstd($\chi$) of the peak intensities using the half-value widths σ1, σ2, and σ3 as weights (FWHMstd($\chi$) =(σ1×peak1+σ2×peak2+σ3×peak3)/(peak1+peak2+peak3)) is equal to or less than 12°.

2. An electromechanical transducer element comprising:
   a lower electrode formed directly or indirectly on one of a substrate and a base layer;
   an electromechanical transducer film of a piezoelectric material formed on the lower electrode, the electromechanical transducer film having a {100}-oriented perovskite crystal structure; and
   an upper electrode formed on the electromechanical transducer film,
   wherein the electromechanical transducer film has characteristics such that a diffraction intensity peak profile of a {200} plane of the film obtained by measurement according to a locking curve method and multiplied by sin ω for an irradiation area correction of the peak profile, is capable of being separated into three peak profiles by peak separation, and when peak intensities of the three peak profiles are set to peak1', peak2' and peak3' and half-value widths of the three peak profiles are set to σ1', σ2', and σ3', a weighted average FWHMstd(ω) of the peak intensities using the half-value widths σ1', σ2' and σ3' as weights (FWHMstd(ω)= (σ1'×peak1'+σ2'×peak2'+σ3'×peak3')/(peak1'+peak2'+peak3')) is equal to or less than 10°.

3. The electromechanical transducer element according to claim 1, wherein when tilt angles at which the diffraction intensities of the three peak profiles are the maximum are set to $\chi$1, $\chi$2, and $\chi$3, respectively, and $\chi$2 is a tilt angle corresponding to a crystal plane grown approximately in a vertical direction to a surface of the substrate, an arithmetic average $\chi$std (=(|$\chi$2−$\chi$1|+|$\chi$3−$\chi$2|)/2) of an absolute-value |$\chi$2−$\chi$1| of a difference of $\chi$2 and $\chi$1 and an absolute-value |$\chi$3−$\chi$2| of a difference of $\chi$3 and $\chi$2 is in a range from 1° to 5°.

4. The electromechanical transducer element according to claim 2, wherein, when angles between a sample substrate surface and an incidence angle of an X ray at which diffraction intensities of the three peak profiles are the maximum are set to ω1, ω2 and ω3 in ascending order (ω1<ω2<ω3), an arithmetic average ωstd (=(($\chi$2−$\chi$1)+(ω3−ω2))/2) of ($\chi$2−$\chi$1) and (ω3−ω2) is in a range from 1° to 5°.

5. The electromechanical transducer element according to claim 1, wherein when denotes a diffraction intensity of a diffraction intensity peak profile corresponding to a {hkl} plane of the film, where each of h, k and l denotes an integer, ΣI denotes a sum of diffraction intensities of diffraction intensity peak profiles corresponding to respective planes of the film from which the diffraction intensity peak profiles are obtained by the measurement and ρ{hkl} denotes a ratio of and ΣI (ρ{hkl}=I{hkl}/ΣI), ρ{100} is equal to or greater than 0.75.

6. The electromechanical transducer element according to claim 1, wherein a back surface of the substrate includes an etched portion, and the position (2θ) where the diffraction intensity of the peak profile corresponding to the {200} plane among the peak profiles of the film obtained by the measurement according to the X-ray diffraction θ-2θ method when there is no restriction in the etched portion of the back surface of the substrate is the maximum is in a range from 44.45° to 44.75°, and both the peak profile corresponding to the {200} plane and a peak profile corresponding to a {400} plane among the peak profiles obtained by the measurement according to the X-ray diffraction θ-2θ method have an asymmetrical shape.

7. The electromechanical transducer element according to claim 1, wherein when the diffraction intensity peak profile corresponding to the {200} plane and a diffraction intensity peak profile corresponding to a {400} plane among the diffraction intensity peak profiles of the film obtained by the measurement according to the X-ray diffraction (θ-2θ) method are separated into peak profiles by the peak separation, the peak profiles obtained by the peak separation include a peak profile derived from an a-axis domain tetragonal structure and a peak profile derived from a c-axis domain tetragonal structure.

8. The electromechanical transducer element according to claim 1, further comprising:
   a seed layer made of lead titanate and disposed between the electromechanical transducer film and the lower electrode.

9. A liquid droplet discharge head comprising:
   a nozzle to discharge droplets of liquid;
   a pressure chamber in communication with the nozzle; and
   a pressure generation unit to generate pressure in the liquid in the pressure chamber,
   wherein the pressure generation unit comprises the electromechanical transducer element according to claim 1.

10. A liquid droplet discharge head comprising:
    a nozzle to discharge droplets of liquid;
    a pressure chamber in communication with the nozzle; and a pressure generation unit to generate pressure in the liquid in the pressure chamber,
wherein the pressure generation unit comprises the electromechanical transducer element according to claim 2.

11. An image forming apparatus comprising the liquid droplet discharge head according to claim 9.

12. An image forming apparatus comprising the liquid droplet discharge head according to claim 10.

* * * * *